(12) United States Patent
Nakashiba et al.

(10) Patent No.: US 9,146,348 B2
(45) Date of Patent: Sep. 29, 2015

(54) OPTICAL-ELECTRICAL COMPOSITE FLEXIBLE CIRCUIT SUBSTRATE INCLUDING OPTICAL CIRCUIT AND ELECTRICAL CIRCUIT

(75) Inventors: Toru Nakashiba, Osaka (JP); Naoyuki Kondo, Osaka (JP); Junko Yashiro, Osaka (JP); Shinji Hashimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 149 days.

(21) Appl. No.: 13/978,380

(22) PCT Filed: Dec. 26, 2011

(86) PCT No.: PCT/JP2011/007258
§ 371 (c)(1),
(2), (4) Date: Jul. 3, 2013

(87) PCT Pub. No.: WO2012/093462
PCT Pub. Date: Jul. 12, 2012

(65) Prior Publication Data
US 2013/0287335 A1    Oct. 31, 2013

(30) Foreign Application Priority Data
Jan. 7, 2011   (JP) ................................. 2011-001579

(51) Int. Cl.
*G02B 6/42*   (2006.01)
*G02B 6/43*   (2006.01)
(Continued)

(52) U.S. Cl.
CPC    *G02B 6/12* (2013.01); *G02B 6/122* (2013.01); *G02B 6/13* (2013.01); *H05K 1/0274* (2013.01); *G02B 6/4214* (2013.01); *G02B 6/43* (2013.01); *H05K 1/028* (2013.01)

(58) Field of Classification Search
CPC .......................................................... G02B 6/00
USPC ............................................................. 385/14
See application file for complete search history.

(56) References Cited

U.S. PATENT DOCUMENTS 5,195,154 A * 3/1993 Uchida ............................ 385/88
5,277,930 A * 1/1994 Uchida ......................... 427/162
(Continued)

FOREIGN PATENT DOCUMENTS

JP    07-283494 A    10/1995
JP    11-121881 A    4/1999
(Continued)

OTHER PUBLICATIONS

International Search Report issued in International Application No. PCT/JP2011/007258 date of mailing Mar. 19, 2012.
(Continued)

*Primary Examiner* — Akm Enayet Ullah
(74) *Attorney, Agent, or Firm* — McDermott Will & Emery LLP

(57)    ABSTRACT

An optical-electrical composite flexible circuit substrate having sufficiently high bending resistance is provided. An optical-electrical composite flexible circuit substrate includes: an optical circuit that includes a core portion and a cladding layer that covers the core portion; and an electrical circuit, with the optical circuit and the electrical circuit being disposed at a position that includes a neutral surface when the optical-electrical composite flexible circuit substrate is bent, or at a position near the neutral surface. Alternatively, the optical-electrical composite flexible circuit substrate may include an optical circuit that includes a core portion and a cladding layer that covers the core portion; and a substrate that includes an electrical circuit, with the substrate and the optical circuit being laminated so that the electrical circuit is disposed on a side closer to the optical circuit.

4 Claims, 17 Drawing Sheets

(51) Int. Cl.
*G02B 6/12* (2006.01)
*G02B 6/122* (2006.01)
*G02B 6/13* (2006.01)
*H05K 1/02* (2006.01)

(56) References Cited

U.S. PATENT DOCUMENTS

| | | | |
|---|---|---|---|
| 7,163,598 B2 * | 1/2007 | Okubora et al. | 156/249 |
| 7,330,612 B2 * | 2/2008 | Nakashiba et al. | 385/14 |
| 8,761,551 * | 6/2014 | Kim et al. | 385/14 |
| 2005/0111777 A1 * | 5/2005 | Stenger et al. | 385/14 |
| 2009/0263077 A1 * | 10/2009 | Ushiwata et al. | 385/14 |
| 2010/0119191 A1 * | 5/2010 | Shibata et al. | 385/14 |
| 2011/0222815 A1 * | 9/2011 | Hamana et al. | 385/14 |
| 2012/0219799 A1 * | 8/2012 | Omori | 428/402 |

FOREIGN PATENT DOCUMENTS

| | | |
|---|---|---|
| JP | 2006-284925 A | 10/2006 |
| JP | 2007-150179 A | 6/2007 |
| JP | 2008-089827 A | 4/2008 |
| JP | 2009-265164 A | 11/2009 |
| JP | 2010-054617 A | 3/2010 |
| WO | WO 2008/007673 A1 | 1/2008 |

OTHER PUBLICATIONS

Toru Nakashiba et al., Optical-electrical flexible printed wiring board, Matsushita Electric Works Technical Report, Matsushita Electric Works, Ltd., Sep. 2006, vol. 54, No. 3, p. 38-43.

* cited by examiner

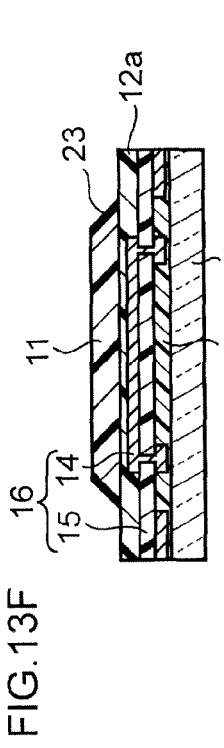
FIG.13A
FIG.13B
FIG.13C
FIG.13D
FIG.13E
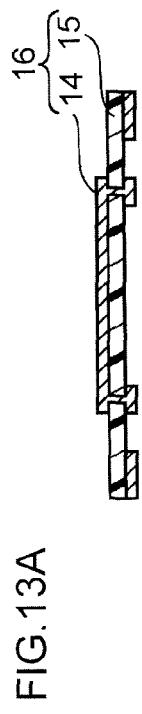
FIG.13F
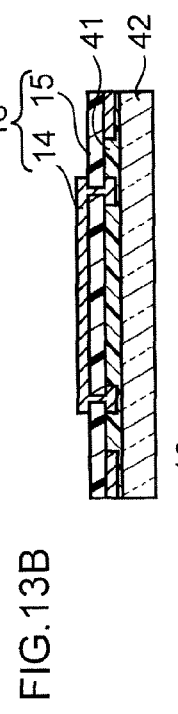
FIG.13G
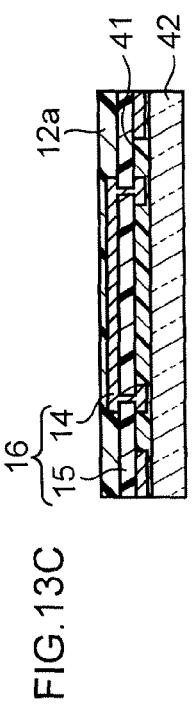
FIG.13H
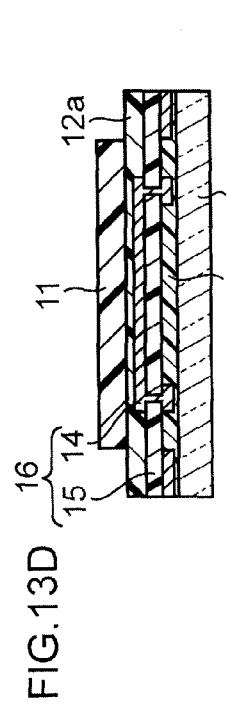
FIG.13I

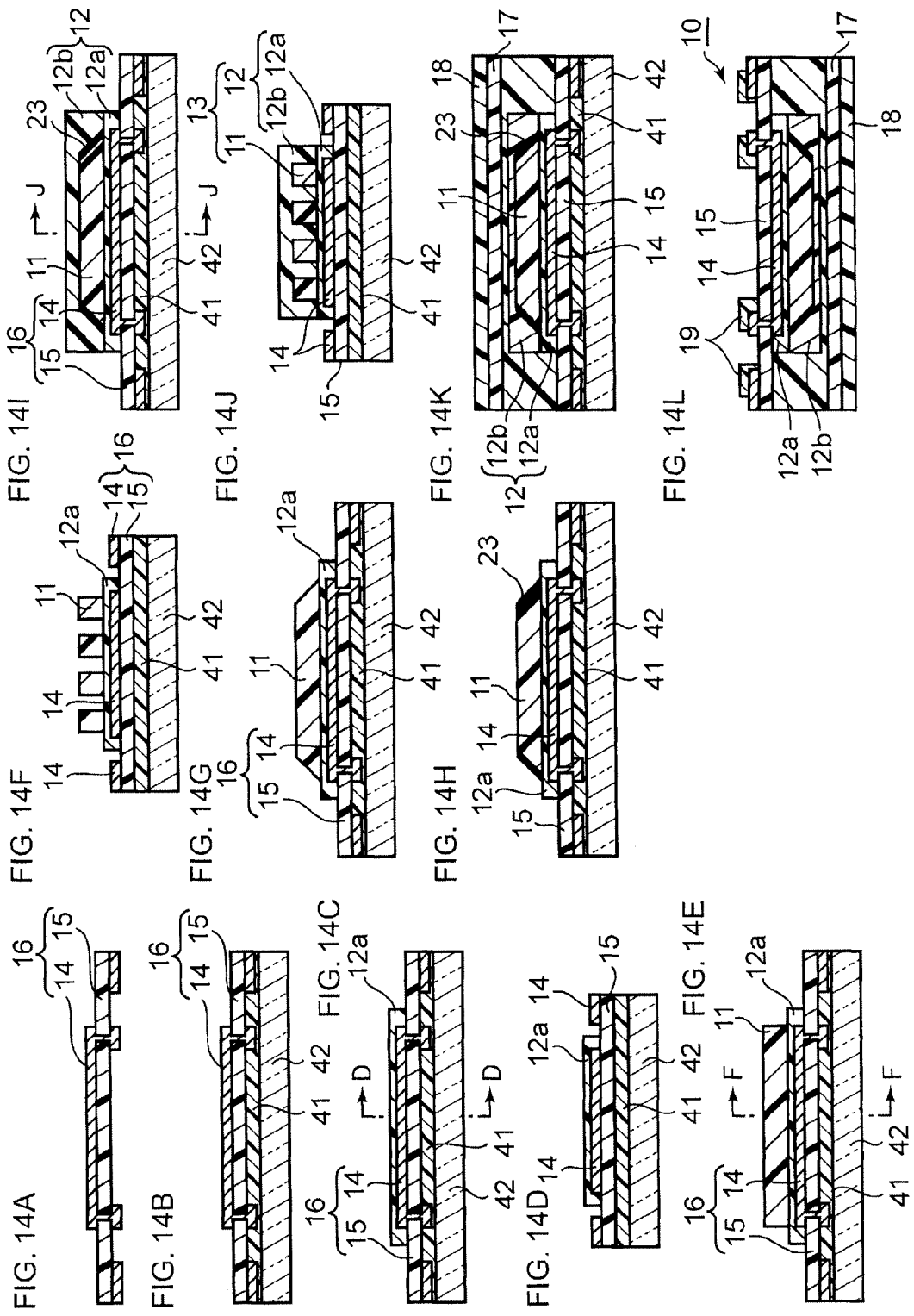

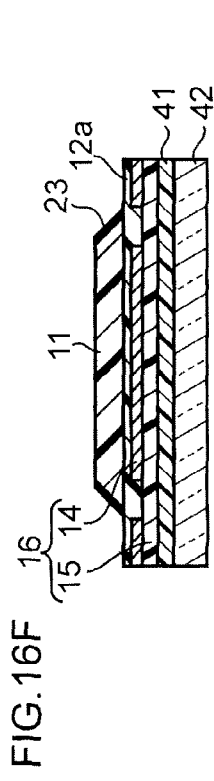
FIG.16A
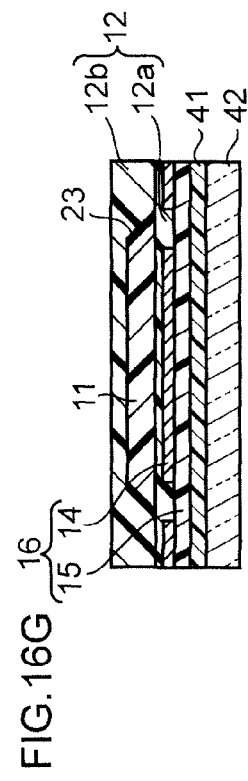
FIG.16B
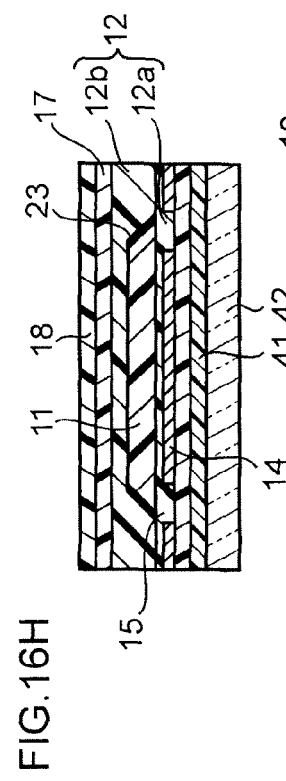
FIG.16C
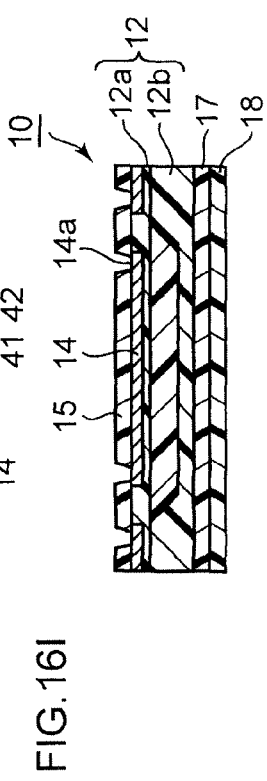
FIG.16D
FIG.16E
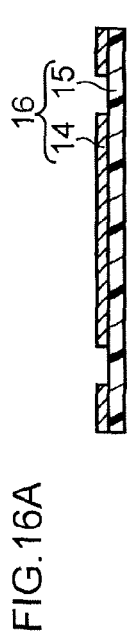
FIG.16F
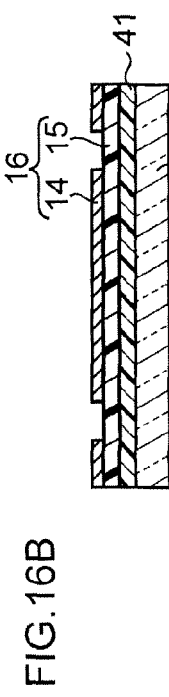
FIG.16G
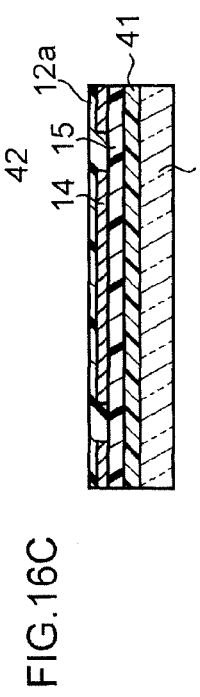
FIG.16H
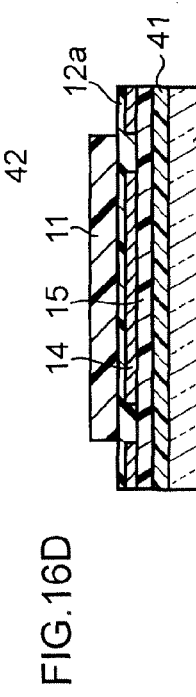
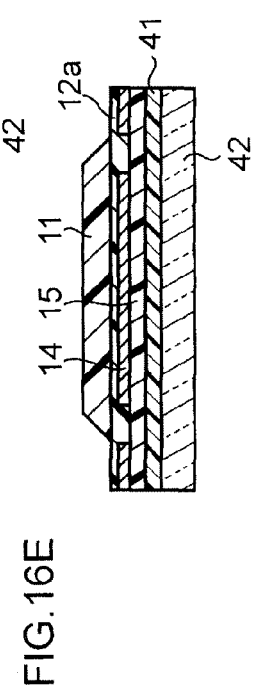
FIG.16I

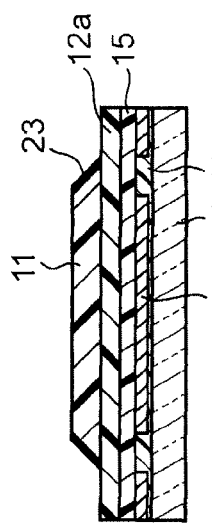
FIG.19A
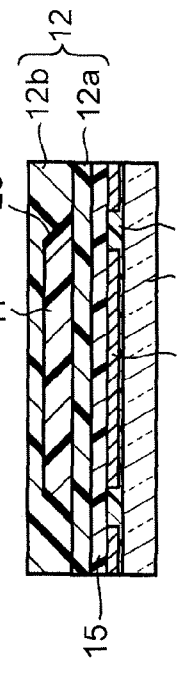
FIG.19B
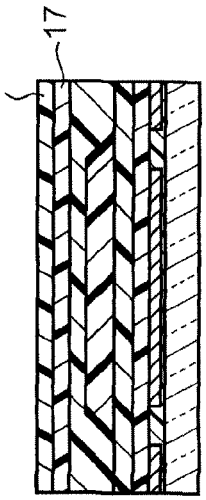
FIG.19C
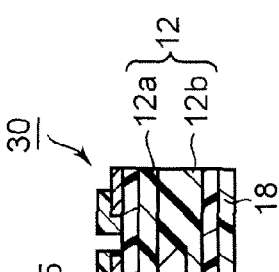
FIG.19D
FIG.19E
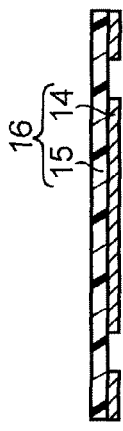
FIG.19F
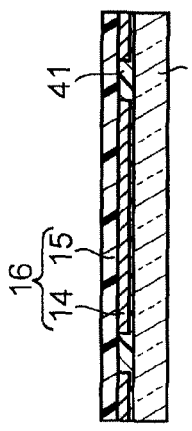
FIG.19G
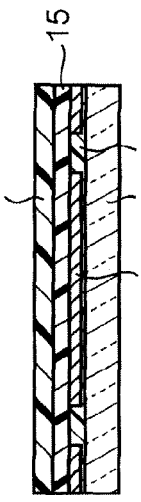
FIG.19H
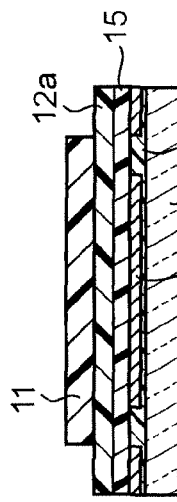
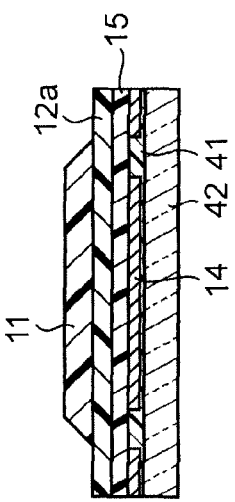
FIG.19I

OPTICAL-ELECTRICAL COMPOSITE FLEXIBLE CIRCUIT SUBSTRATE INCLUDING OPTICAL CIRCUIT AND ELECTRICAL CIRCUIT

RELATED APPLICATIONS

This application is the U.S. National Phase under 35 U.S.C. §371 of International Application No. PCT/JP2011/007258, filed on Dec. 26, 2011, which in turn claims the benefit of Japanese Application No. 2011-001579, filed on Jan. 7, 2011, the disclosures of which Applications are incorporated by reference herein.

TECHNICAL FIELD

The present invention relates to an optical-electrical composite flexible circuit substrate.

BACKGROUND ART

High speed data transmission is required in the field of middle- to long-range communication (specifically, FTTH (Fiber To The Home) communication, in-vehicle communication, and the like). In order to realize this, optical fiber cables have been used as transmission media.

High speed data transmission is also required in short-range communication (for example, communication within 1 meter). In such a short-range communication field, performances that are difficult to realize with optical fiber cables are also required. Specifically, examples of the requirements include high-density wiring such as a narrow pitch, branching, crossing, or multi-layer, surface mounting properties, integration with an electrical circuit substrate, and bending with a small radius of curvature. A wiring substrate including an optical circuit can be used as one that satisfies these requirements.

In addition, in the optical circuit, an inclined surface capable of reflecting light is formed in a core portion or the like of the optical circuit in order to deflect light at a desired angle to input and output light, for example. Moreover, the wiring substrate including such an optical circuit preferably includes an electrical circuit in order to drive a light-emitting element such as a vertical-cavity surface-emitting laser (VCSEL), a light-receiving element such as a photodiode (PD), and a semiconductor element such as an integrated circuit (IC). That is, the wiring substrate is preferably an optical-electrical composite wiring substrate that includes the optical circuit and the electrical circuit. An example of such an optical-electrical composite wiring substrate includes a bendable optical-electrical composite flexible circuit substrate. The optical-electrical composite flexible circuit substrate is attracting attention and can be used instead of a flexible wiring substrate disposed with a hinge of a small terminal device interposed.

Non Patent Document 1 discloses an example of such an optical-electrical composite flexible circuit substrate.

Non Patent Document 1 discloses an optical-electrical composite flexible circuit substrate in which an optical waveguide film serving as an optical wiring layer and an electrical flexible wiring substrate serving as an electrical wiring layer are laminated. In the optical-electrical composite flexible circuit substrate, the optical waveguide film is laminated on a surface of the electrical flexible wiring substrate, with this surface being on a side where an electrical circuit is not provided, such that an electrical circuit formed in the electrical flexible wiring substrate can be connected to a light-emitting element.

According to Non Patent Document 1, it is possible to obtain an optical-electrical composite flexible circuit substrate having excellent optical properties such as excellent insertion loss and high reliability such as small betiding deterioration.

In addition, the optical-electrical composite flexible circuit substrate requires higher reliability. Specifically, as described above, since the optical-electrical composite flexible circuit substrate is expected to be used instead of the flexible wiring substrate disposed with the hinge of a small terminal device interposed, the optical-electrical composite flexible circuit substrate is required to have smaller bending deterioration (that is, higher bending resistance).

Non Patent Document 1: Toru Nakashiba and two others, *Hikari/denki fukugo flekishiburu print haisenban* [Optical-electrical flexible printed wiring board], Matsushita Electric Works Technical Report, Matsushita Electric Works Ltd, September 2006, vol. 54, No. 3, p. 38-43

SUMMARY OF THE INVENTION

With the foregoing in view, it is an object of the present invention to provide an optical-electrical composite flexible circuit substrate having sufficiently high bending resistance.

According to an aspect of the present invention, there is provided an optical-electrical composite flexible circuit substrate including: an optical circuit that includes a core portion and a cladding layer that covers the core portion; and an electrical circuit, wherein the optical circuit and the electrical circuit are disposed at a position that includes a neutral surface when the optical-electrical composite flexible circuit substrate is bent, or at a position near the neutral surface.

In the optical-electrical composite flexible circuit substrate, it is preferable that the optical circuit and the electrical circuit are disposed so that a position of the electrical circuit in a thickness direction of the optical-electrical composite flexible circuit substrate overlaps a position of the optical circuit in the thickness direction of the optical-electrical composite flexible circuit substrate, and that the neutral surface when the optical-electrical composite flexible circuit substrate is bent is positioned in at least one of the optical circuit and the electrical circuit.

In the optical-electrical composite flexible circuit substrate, it is preferable that the electrical circuit is in contact with the optical circuit.

In the optical-electrical composite flexible circuit substrate, it is preferable that the core portion and the electrical circuit are disposed with the neutral surface interposed.

In the optical-electrical composite flexible circuit substrate, it is preferable that the electrical circuit includes a connecting portion that is electrically connected to an external unit, and the connecting portion is exposed to the outside of the optical-electrical composite flexible circuit substrate so as to be electrically connected to the electrical circuit other than the connecting portion.

According to another aspect of the present invention, there is provided an optical-electrical composite flexible circuit substrate including: an optical circuit that includes a core portion and a cladding layer that covers the core portion; and a substrate that includes an electrical circuit, wherein the substrate and the optical circuit are laminated so that the electrical circuit is disposed on a side closer to the optical circuit.

In the optical-electrical composite flexible circuit substrate, it is preferable that the electrical circuit includes a connecting portion that is exposed from a surface of the substrate at a position located away from the optical circuit so as to be electrically connected to an external unit.

BRIEF DESCRIPTION OF THE DRAWINGS

FIGS. 13A to 13I are schematic views for explaining a method of manufacturing an optical-electrical composite wiring substrate.

FIGS. 14A to 14L are schematic views for explaining another method of manufacturing an optical-electrical composite wiring substrate.

FIGS. 16A to 16I are schematic views for explaining another method of manufacturing an optical-electrical composite wiring substrate.

FIGS. 19A to 19I are schematic views for explaining a method of manufacturing the optical-electrical composite wiring substrate shown in FIGS. 17A and 17B.

DESCRIPTION OF EMBODIMENTS

Hereinafter, embodiments of the present invention will be described.

Figures 1A, 1B:
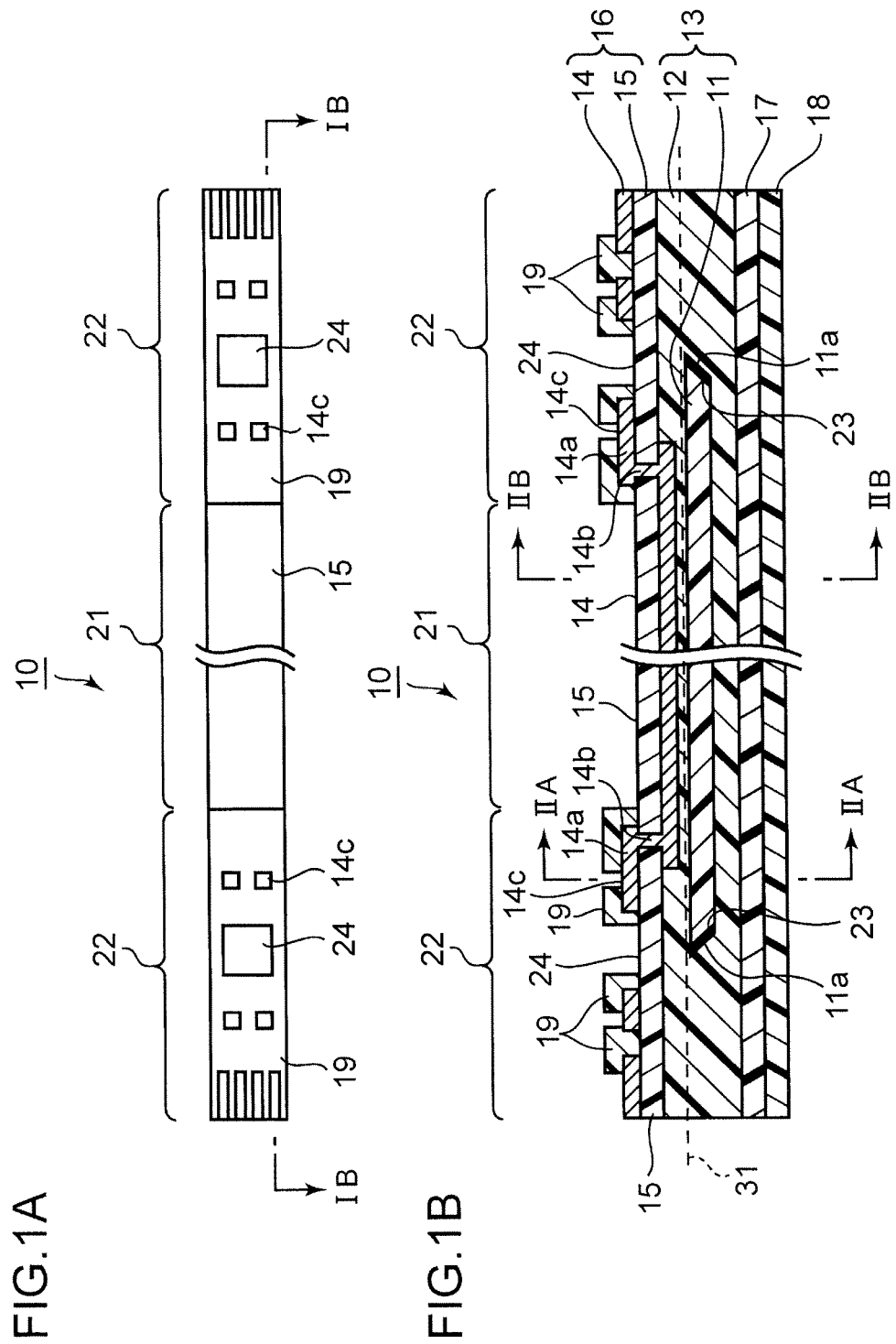
FIGS. 1A and 1B are schematic views showing an optical-electrical composite flexible circuit substrate according to an embodiment of the present invention.
Figure 2A:
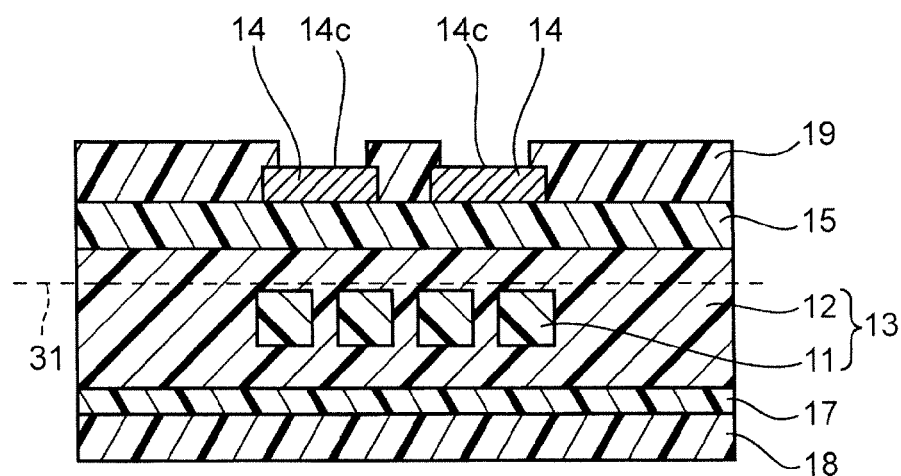
FIGS. 2A and 2B are schematic cross-sectional views of the optical-electrical composite flexible circuit substrate shown in FIGS. 1A and 1B.
Figure 2B:
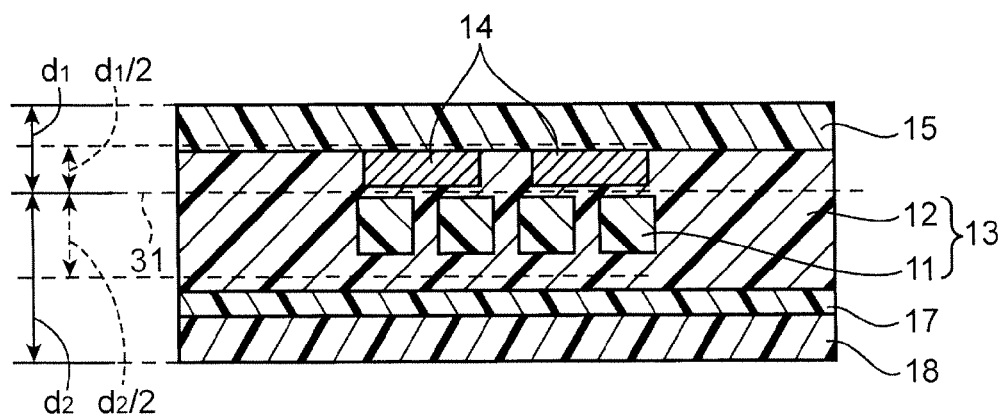

An optical-electrical composite flexible circuit substrate according to an embodiment of the present invention is an optical-electrical composite flexible circuit substrate that includes an optical circuit that includes a core portion and a cladding layer that covers the core portion, and an electrical circuit. The optical circuit and the electrical circuit are disposed at a position that includes a neutral surface when the optical-electrical composite flexible circuit substrate is bent or at a position near the neutral surface. Specifically, an optical-electrical composite flexible circuit substrate shown in FIGS. 1A, 1B, 2A, and 2B is an example thereof. FIGS. 1A and 1B are schematic views showing an optical-electrical composite flexible circuit substrate according to an embodiment of the present invention. FIG. 1A is a schematic view (that is, a top view) showing an optical-electrical composite flexible circuit substrate as seen from the electrical circuit. FIG. 1B is a schematic cross-sectional view along line IB-IB, of the optical-electrical composite flexible circuit substrate shown in FIG. 1A. Moreover, FIGS. 2A and 2B are schematic cross-sectional views of the optical-electrical composite flexible circuit substrate shown in FIGS. 1A and 1B. FIG. 2A is a schematic cross-sectional view along line IIA-IIA, of the optical-electrical composite flexible circuit substrate shown in FIG. 1B. FIG. 2B is a schematic cross-sectional view along line IIB-IIB, of the optical-electrical composite flexible circuit substrate shown in FIG. 1B.

As shown in FIGS. 1A, 1B, 2A, and 2B, an optical-electrical composite flexible circuit substrate 10 according to an embodiment of the present invention includes an optical circuit 13 that includes a core portion 11 and a cladding layer 12 that covers the core portion 11, and an electrical circuit 14. The optical circuit 13 and the electrical circuit 14 are disposed at a position near a neutral surface 31 when the optical-electrical composite flexible circuit substrate 10 is bent, in a bending region 21 in which at least the optical-electrical composite flexible circuit substrate 10 is bent. That is, the optical-electrical composite flexible circuit substrate 10 has the bending region 21 which is a region in which the optical circuit 13 and the electrical circuit 14 are positioned at a central portion in a thickness direction of the optical-electrical composite flexible circuit substrate 10. Moreover, the optical circuit 13 and the electrical circuit 14 may be disposed at a position that includes the neutral surface when the optical-electrical composite flexible circuit substrate is bent, or at a position near the neutral surface. That is, the positions of the optical circuit 13 and the electrical circuit 14 are not limited to the positions shown in FIGS. 1A, 1B, 2A, and 2B, and one of the optical circuit 13 and the electrical circuit 14 may be disposed at a position that includes the neutral surface 31 when the optical-electrical composite flexible circuit substrate 10 is bent. The neutral surface will be described later.

In addition, in the optical-electrical composite flexible circuit substrate 10, a first insulating layer 15 is formed on a side of the electrical circuit 14 located away from the optical circuit 13. The first insulating layer 15 forms an electrical flexible wiring substrate 16 together with the electrical circuit 14. That is, the optical-electrical composite flexible circuit substrate 10 includes the optical circuit 13 and a substrate (electrical flexible wiring substrate) 16 that includes the electrical circuit 14 and the first insulating layer 15 and has the bending region 21 which is a region in which the substrate 16 and the optical circuit 13 are laminated so that the electrical circuit 14 is disposed on a side closer to the optical circuit 13. A second insulating layer 18 such as a coverlay layer is also formed on a side of the optical circuit 13 located away from the electrical circuit 14 with an adhesive layer 17 interposed.

In addition, in the optical-electrical composite flexible circuit substrate 10, when a distance between a surface of the optical-electrical composite flexible circuit substrate 10 closer to the first insulating layer 15 and the neutral surface 31 is $d_1$, and a distance between a surface of the optical-electrical composite flexible circuit substrate 10 closer to the second insulating layer 18 and the neutral surface 31 is $d_2$, as shown in FIG. 2B, in the bending region 21, the core portion 11 and the electrical circuit 14 are present at the inner side than half ($d_1/2$) of $d_1$ and at the inner side than half ($d_2/2$) of $d_2$. In this manner, the core portion 11 and the electrical circuit 14 are disposed near the neutral surface 31 when the optical-electrical composite flexible circuit substrate 10 is bent. That is, the optical circuit 13 that includes the core portion 11 and the electrical circuit 14 are disposed at a position near the neutral surface 31.

The optical-electrical composite flexible circuit substrate 10 includes mounting regions 22 that are provided at both ends in the longitudinal direction thereof so as to mount components other than the optical-electrical composite flexible circuit substrate 10 and a bending region 21 disposed between the mounting regions 22. When the optical-electrical composite flexible circuit substrate 10 is applied to a small terminal device, the optical-electrical composite flexible circuit substrate 10 is disposed so that the bending region 21 is positioned in a hinge portion. That is, the optical-electrical composite flexible circuit substrate 10 can be used instead of an electrical flexible wiring substrate included in a small terminal device.

As described above, although the electrical circuit 14 is disposed near the neutral surface 31 together with the optical circuit 13 at least in the bending region 21, the electrical circuit 14 includes a connecting portion 14a that electrically connects the electrical circuit 14 to the outside of the optical-electrical composite flexible circuit substrate 10. The connecting portion 14a is exposed to the outside of the optical-electrical composite flexible circuit substrate 10 so as to be electrically connected to the electrical circuit 14 other than the connecting portion 14a. Specifically, the connecting portion 14a disposed on a surface of the optical-electrical composite flexible circuit substrate 10 located away from the optical circuit 13 is electrically connected to the electrical circuit 14 that is disposed near the neutral surface 31 in the bending region 21 through a through-hole 14b. Moreover, in the optical-electrical composite flexible circuit substrate 10, portions of the electrical circuit 14 exposed to the outside, on which components are not mounted, are coated with a solder resist layer 19 in order to prevent corrosion. By doing so, the connecting portion 14a forms an exposed surface 14c on which components can be mounted.

The optical circuit 13 is not particularly limited as long as the optical circuit 13 can be provided in the optical-electrical composite wiring substrate. Specifically, as described above, the optical circuit 13 includes the core portion 11 and the cladding layer 12 that covers the core portion 11 and forms an optical waveguide that allows light to be reflected from the interface between the core portion 11 and the cladding layer 12 to propagate through the core portion. The core portion 11 has an inclined surface 11a that reflects light so that light entering from the outside of the optical-electrical composite flexible circuit substrate 10 is guided into the core portion 11 or light output from the core portion 11 is guided to the outside of the optical-electrical composite flexible circuit substrate 10. An example of the inclined surface 11a has an inclination angle of 45° with respect to the plane direction of the optical-electrical composite flexible circuit substrate 10, for example. The inclined surface 11a may include a metal layer 23 in order to increase reflectivity of light. Moreover, this inclined surface is formed in the mounting region 22. The electrical circuit 14 and the solder resist layer 19 are not formed in a region of the inclined surface 11a, through which light passes when light entering from the outside of the optical-electrical composite flexible circuit substrate 10 is guided into the core portion 11 or light output from the core portion 11 is guided to the outside of the optical-electrical composite flexible circuit substrate 10. That is, a light passing portion 24 is formed. Specifically, the light passing portion 24 is formed in a portion of the inclined surface 11a located on the upper side in the thickness direction of the optical-electrical composite flexible circuit substrate 10.

Figure 3:
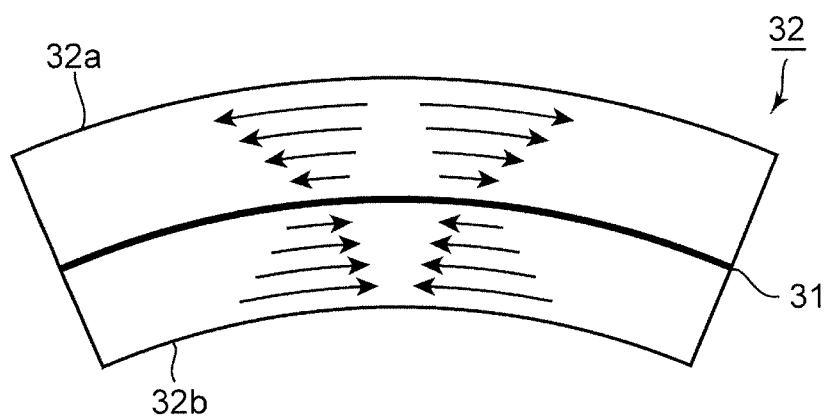
FIG. 3 is a conceptual diagram for explaining a neutral surface.

The neutral surface is a surface to which bending force is not applied or a surface in which the bending force is weakest when the optical-electrical composite flexible circuit substrate is bent. The neutral surface will be described in detail with reference to FIG. 3. FIG. 3 is a conceptual diagram for explaining the neutral surface 31. First, as shown in FIG. 3, when a base member 32 such as an optical-electrical composite flexible circuit substrate is bent, pulling force is applied to the outer side of the bending (that is, a surface 32a located away from the center of curvature). The farther from the center of curvature, the stronger is the force, whereas the closer to the center of curvature, the weaker is the force. Moreover, as shown in FIG. 3, when the base member 32 such as an optical-electrical composite flexible circuit substrate is bent, compressive force is applied to the inner side of the bending (that is, a surface 32b located closer to the center of curvature). The closer to the center of curvature, the stronger is the force, whereas the farther from the center of curvature, the weaker is the force. Due to these reasons, there are positions at which the compressive force changes into the pulling force as it advances from the side closer to the center of curvature toward the side away from the center of curvature. A surface made up of such positions is the neutral surface 31.

Figure 4:
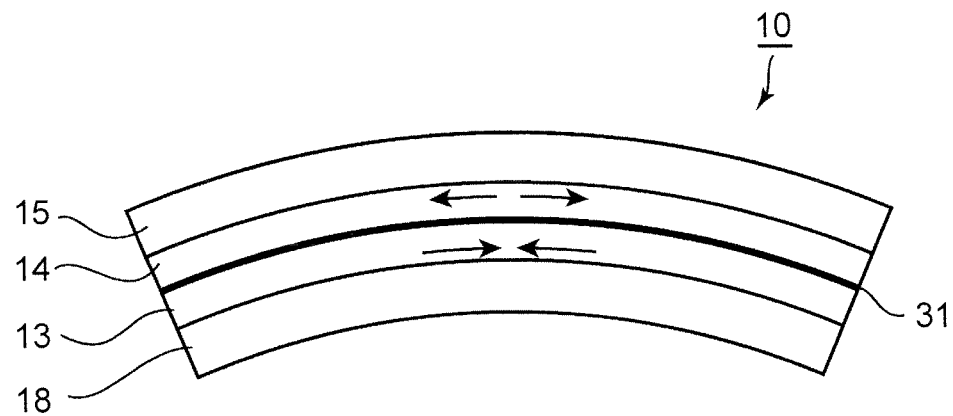
FIG. 4 is a conceptual diagram for explaining how force is applied when an electrical circuit and an optical circuit are present at a position that includes a neutral surface or at a position near the neutral surface.

How force is applied when the electrical circuit 14 and the optical circuit 13 are present at a position that includes the neutral surface 31 or at a position near the neutral surface 31 will be described with reference to FIG. 4. FIG. 4 is a conceptual diagram for explaining how force is applied when the electrical circuit 14 and the optical circuit 13 are present at a position that includes the neutral surface 31 or at a position near the neutral surface 31. As shown in FIG. 4, when the electrical circuit 14 and the optical circuit 13 are disposed at a position that includes the neutral surface 31 or at a position near the neutral surface 31, it is expected that the force applied to the electrical circuit 14 and the optical circuit 13 is small even if the optical-electrical composite flexible circuit substrate 10 is bent. Thus, it is expected that the optical-electrical composite flexible circuit substrate has excellent bending resistance when the electrical circuit 14 and the optical circuit 13 are disposed at the position that includes the neutral surface 31 or at the position near the neutral surface 31.

Figure 5:
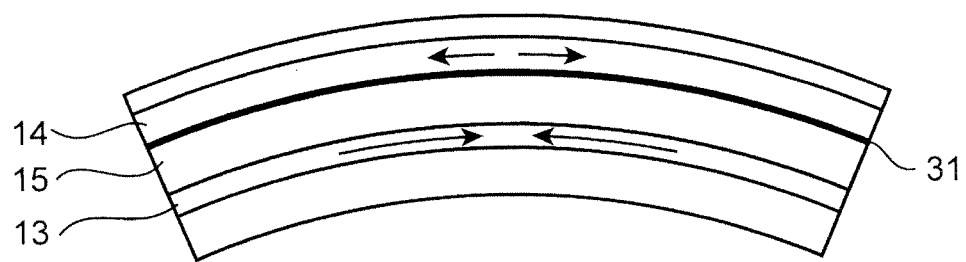
FIG. 5 is a conceptual diagram for explaining how force is applied when the optical circuit is not present near the neutral surface.

In contrast, how force is applied when at least one of the electrical circuit and the optical circuit is not present near the neutral surface will be described. Specifically, a case where an optical waveguide film for forming an optical circuit is simply laminated on a surface of an electrical flexible wiring substrate, on which an electrical circuit is not provided, can be considered. In such a case, an insulating layer which is a substrate of the electrical flexible wiring substrate is interposed between the electrical circuit and the optical circuit. That is, when the optical circuit is disposed so as to be located near the neutral surface, the electrical circuit is disposed at a position away from the neutral surface. Moreover, as shown in FIG. 5, when the electrical circuit 14 is disposed so as to be located near the neutral surface 31, the optical circuit 13 is disposed at a position away from the neutral surface. FIG. 5 is a conceptual diagram for explaining how force is applied when the optical circuit 13 is not present near the neutral surface 31. Specifically, it is expected that the force applied is small since the electrical circuit 14 is disposed near the neutral surface 31. Moreover, since the insulating layer 15 is interposed between the optical circuit 13 and the electrical circuit 14, the optical circuit 13 becomes away from the neutral surface 31. Thus, it is expected that the force applied to the optical circuit 13 increases. Thus, when at least one of the electrical circuit and the optical circuit is not present near the neutral surface, at least one of the electrical circuit and the optical circuit has low bending resistance.

The bending resistance means resistance (that is, resistance to continued bending) when a bent state and a non-bent state (straightened state) are repeated. Specifically, an example of the bending resistance is durability of an optical-electrical composite flexible circuit substrate when the optical-electrical composite flexible wiring board is disposed so as to pass through a hinge portion of a small terminal device and the small terminal device is repeatedly opened and closed. An optical-electrical composite flexible circuit substrate which is applied to a sliding-type mobile phone that is expected to require lower bending resistance than a folding-type mobile phone or the like requires such bending resistance that the optical-electrical composite flexible circuit substrate is not broken even after as many as hundreds of thousands of times of bending with a radius of curvature of less than 2 mm were repeated.

In addition, as described above, the electrical circuit 14 may be disposed at the position that includes the neutral surface or at the position near the neutral surface together with the optical circuit 13. Moreover, it is preferable that the optical circuit 13 and the electrical circuit 14 are disposed so that the position of the electrical circuit 14 in the thickness direction of the optical-electrical composite flexible circuit substrate 10 overlaps the position of the optical circuit 13 in the thickness direction of the optical-electrical composite flexible circuit substrate 10 and that the neutral surface 31 when the optical-electrical composite flexible circuit substrate 10 is bent is positioned in at least one of the optical circuit 13 and the electrical circuit 14. That is, it is preferable that the optical circuit 13 and the electrical circuit 14 are disposed so that the electrical circuit 14 is buried in the optical circuit 13 and that the neutral surface 31 when the optical-electrical composite flexible circuit substrate 10 is bent is positioned in at least one of the optical circuit 13 and the electrical circuit 14. By doing so, it is expected that the optical circuit 13 and the electrical circuit 14 are present at the position that includes the neutral surface 31 when the optical-electrical composite flexible circuit substrate 10 is bent or at the position near the neutral surface. That is, it is expected that the optical circuit 13 and the electrical circuit 14 are both disposed at a position more closely to the neutral surface 31. Due to this reason, it is expected that the optical-electrical composite flexible circuit substrate has excellent bending resistance.

In addition, it is preferable that the core portion 11 and the electrical circuit 14 are disposed with the neutral surface 31 interposed as shown in FIG. 2B. By doing so, it is expected that the optical circuit 13 that includes the core portion 11 and the electrical circuit 14 are disposed at the position that includes the neutral surface 31 when the optical-electrical composite flexible circuit substrate 10 is bent or at the position more closely to the neutral surface 31. Thus, it is possible to provide an optical-electrical composite flexible circuit substrate having sufficiently high bending resistance.

Figure 6A:
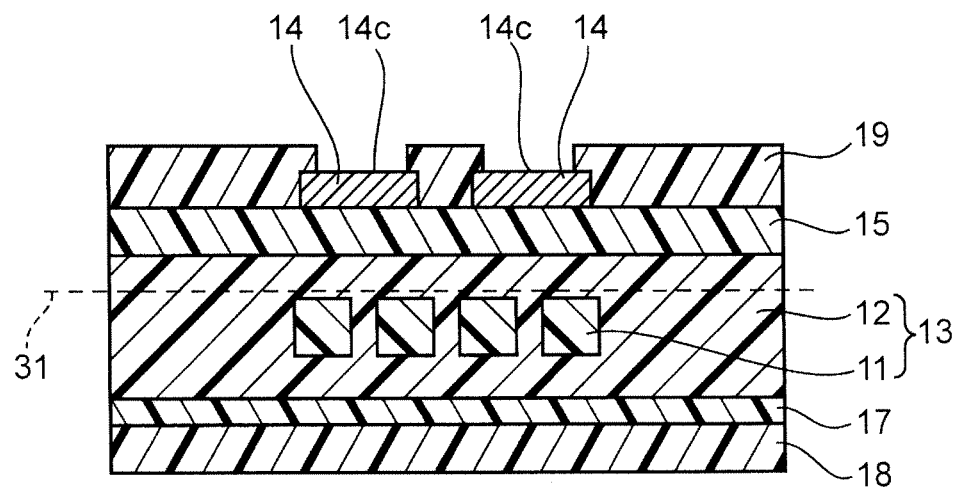
FIGS. 6A and 6B are schematic cross-sectional views showing an optical-electrical composite flexible circuit substrate according to another embodiment of the present invention.
Figure 6B:
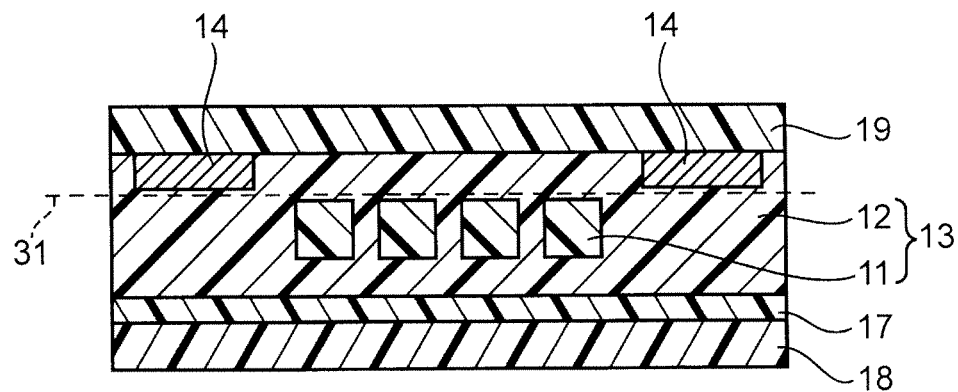

In addition, the electrical circuit 14 is not limited to the position shown in FIGS. 2A and 2B, and the electrical circuit 14 may be disposed at a position shown in FIGS. 6A and 6B as long as the electrical circuit 14 and the optical circuit 13 are disposed at the position that includes the neutral surface 31 or at the position near the neutral surface in the bending region 21. Specifically, as described above, as shown in FIG. 2B, the position of the electrical circuit 14 in the width direction of the optical-electrical composite flexible circuit substrate 10 in the bending region 21 may overlap the position of the core portion 11 of the optical circuit 13 in the width direction of the optical-electrical composite flexible circuit substrate 10. Moreover, as shown in FIG. 6B, the position of the electrical circuit 14 in the width direction of the optical-electrical composite flexible circuit substrate 10 in the bending region 21 may overlap the position of the core portion 11 of the optical circuit 13 in the width direction of the optical-electrical composite flexible circuit substrate 10. That is, the positions of the electrical circuit 14 and the optical circuit 13 in the width direction are not particularly limited as long as the positions of the electrical circuit 14 and the optical circuit 13 in the thickness direction of the optical-electrical composite flexible circuit substrate 10 are at the position that includes the neutral surface 31 or at the position near the neutral surface.

FIGS. 6A and 6B are schematic cross-sectional views showing an optical-electrical composite flexible circuit substrate according to another embodiment of the present invention. FIG. 6A is a schematic cross-sectional view in the mounting region of the optical-electrical composite flexible circuit substrate. FIG. 6B is a schematic cross-sectional view in the bending region of the optical-electrical composite flexible circuit substrate.

Figure 7A:
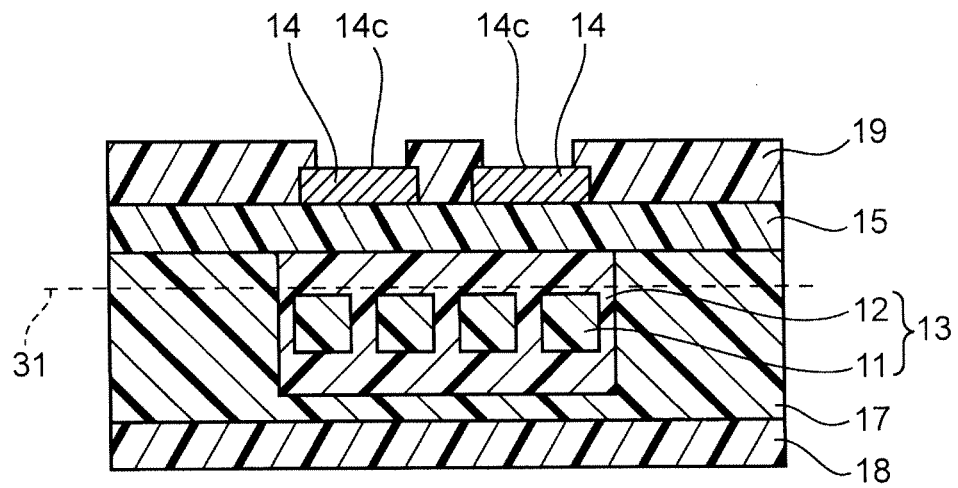
FIGS. 7A and 7B are schematic cross-sectional views showing an optical-electrical composite flexible circuit substrate according to another embodiment of the present invention.
Figure 7B:
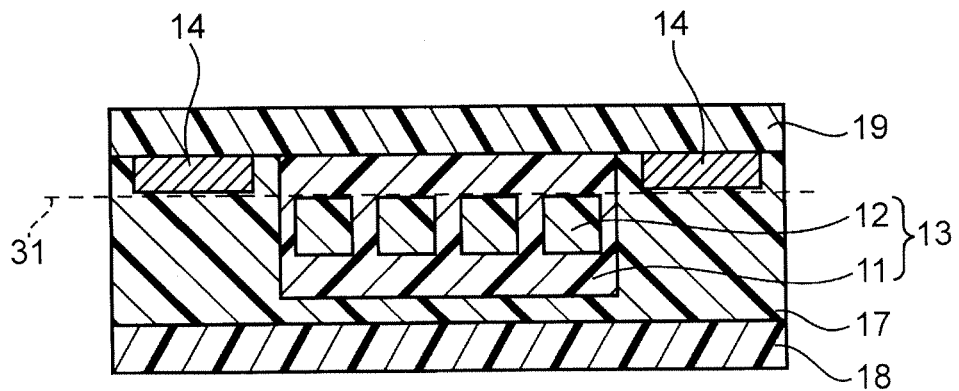

In addition, although the electrical circuit 14 may be in contact with the optical circuit 13 as shown in FIGS. 2A, 2B, 6A, and 6B and may not be in contact with the optical circuit 13 as shown in FIGS. 7A and 7B, it is preferable that the electrical circuit 14 is in contact with the optical circuit 13. By doing so, it is expected that the optical circuit 13 and the electrical circuit 14 are both present at the position that includes the neutral surface 31 when the optical-electrical composite flexible circuit substrate 10 is bent, or at the position near the neutral surface. That is, it is expected that the optical circuit 13 and the electrical circuit 14 are both disposed at a position more closely to the neutral surface 31. Due to this reason, it is expected that the optical-electrical composite flexible circuit substrate has excellent bending resistance.

In addition, as shown in FIGS. 7A and 7B, the optical circuit 13 obtained by forming the cladding layer 12 so as to surround the core portion 11 may be covered with the adhesive layer 17 for adhesively bonding the coverlay layer 18. In this case, a thick adhesive layer capable of covering the optical circuit 13 is used as the adhesive layer 17. By doing so, the electrical circuit 14 can be covered by the adhesive layer 17 for adhesively bonding the coverlay layer 18. By covering the electrical circuit 14 with the adhesive layer 17 in this manner, the electrical circuit 14 and the optical circuit 13 can both be disposed at the position that includes the neutral surface or at the position near the neutral surface, and sealing properties of the electrical circuit 14 can be improved further.

FIGS. 7A and 7B are schematic cross-sectional views showing an optical-electrical composite flexible circuit substrate according to another embodiment of the present invention. FIG. 7A is a schematic cross-sectional view in the mounting region of the optical-electrical composite flexible circuit substrate. FIG. 7B is a schematic cross-sectional view in the bending region of the optical-electrical composite flexible circuit substrate.

The optical-electrical composite flexible circuit substrate according to another embodiment of the present invention is an optical-electrical composite flexible circuit substrate which includes an optical circuit that includes a core portion and a cladding layer that covers the core portion and a substrate that includes an electrical circuit, in which the substrate and the optical circuit are laminated so that the electrical circuit is disposed on a side closer to the optical circuit. A specific example is an optical-electrical composite flexible circuit substrate as shown in FIGS. 8A, 8B, 9A, and 9B.

Figure 8A:
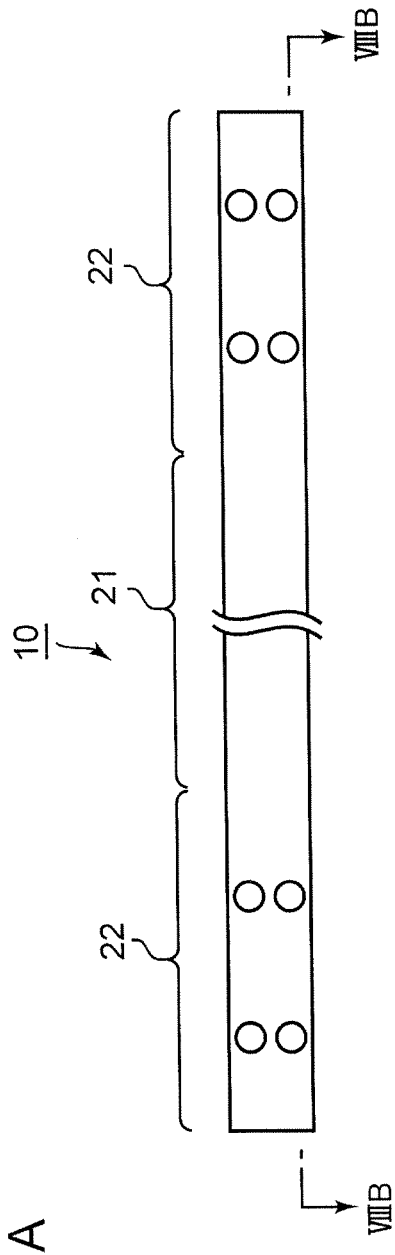
FIGS. 8A and 8B are schematic views showing an optical-electrical composite flexible circuit substrate according to another embodiment of the present invention.
Figure 8B:
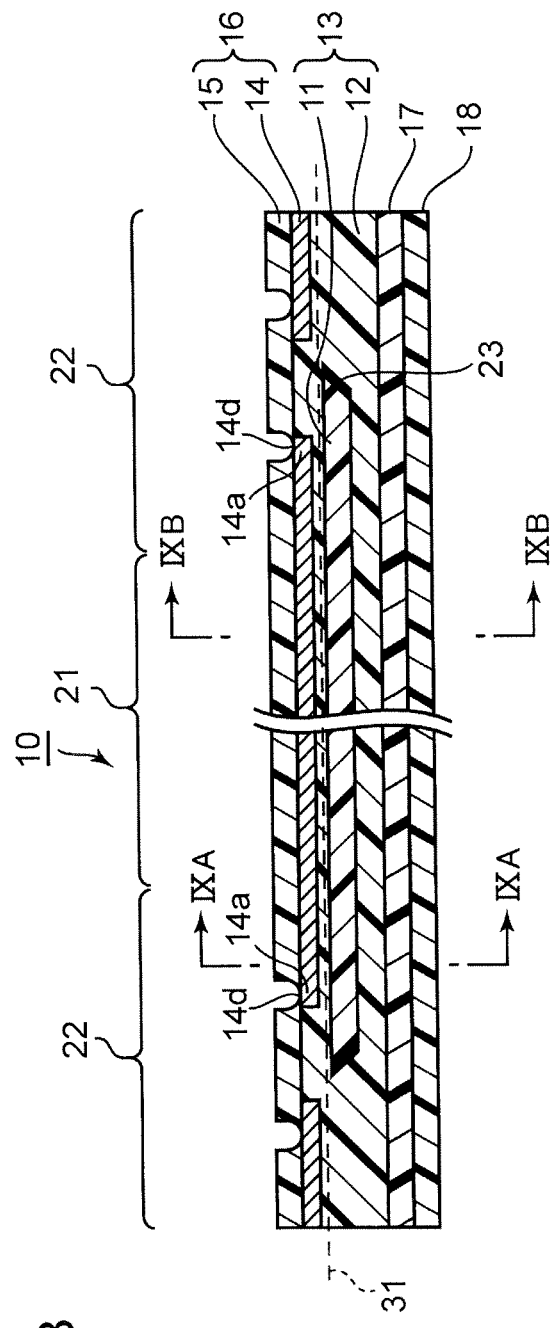
Figure 9A:
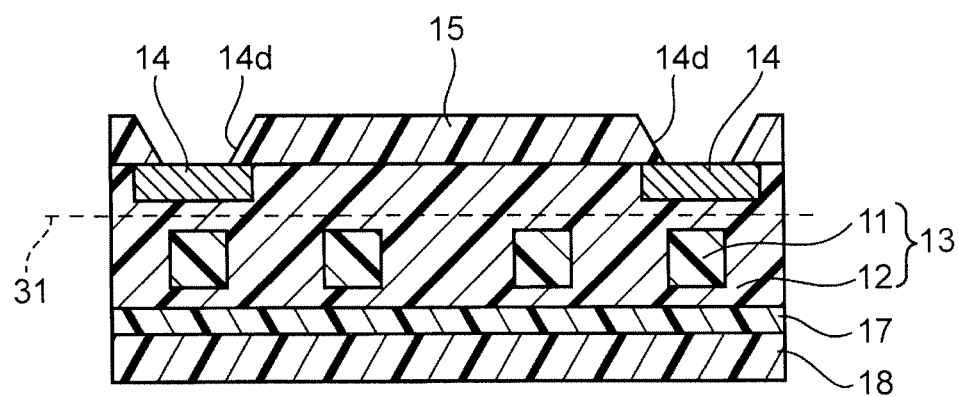
FIGS. 9A and 9B are schematic cross-sectional views of the optical-electrical composite flexible circuit substrate shown in FIGS. 8A and 8B.
Figure 9B:
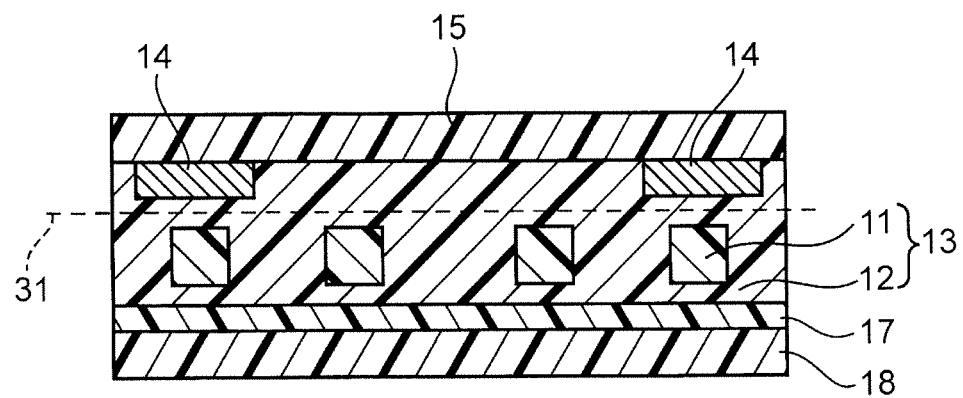

FIGS. 8A and 8B are schematic views showing an optical-electrical composite flexible circuit substrate according to another embodiment of the present invention. FIG. 8A is a schematic view (that is, a top view) showing the optical-electrical composite flexible circuit substrate as seen from the electrical circuit. FIG. 8B is a schematic cross-sectional view along line VIIIB-VIIIB, of the optical-electrical composite flexible circuit substrate shown in FIG. 8A. Moreover, FIGS. 9A and 9B are schematic cross-sectional views of the optical-electrical composite flexible circuit substrate shown in FIGS. 8A and 8B. FIG. 9A is a schematic cross-sectional view along line IXA-IXA, of the optical-electrical composite flexible circuit substrate shown in FIG. 8B. FIG. 9B is a schematic cross-sectional view along line IXB-IXB, of the optical-electrical composite flexible circuit substrate shown in FIG. 8B.

As shown in FIGS. 8A, 8B, 9A, and 9B, the optical-electrical composite flexible circuit substrate according to another embodiment of the present invention has a configuration in which a substrate 16 (that is, an electrical flexible wiring substrate 16) includes a base member (first insulating layer) 15 and an electrical circuit 14 formed on one surface of the base member 15, and an optical circuit 13 is formed on a surface of the substrate 16 closer to the electrical circuit 14. By doing so, the electrical circuit 14 and the optical circuit 13 are disposed in a central portion in the thickness direction of the optical-electrical composite flexible circuit substrate 10. That is, it is expected that the force applied to the optical circuit 13 and the electrical circuit 14 when the optical-electrical composite flexible circuit substrate 10 is bent is smaller than the force applied to the portions located closer to the surface layer than the optical circuit 13 and the electrical circuit 14. Thus, it is expected that the obtained optical-electrical composite flexible circuit substrate has sufficiently high bending resistance.

The connecting portion 14a that is electrically connected to the outside of the optical-electrical composite flexible circuit substrate 10 is not limited to that shown in FIGS. 1A and 1B but may be one as shown in FIGS. 8A and 8B. That is, the electrical circuit 14 may form the connecting portion 14a that is exposed from a surface of the substrate 16 located away from the optical circuit 13 so as to be electrically connected to the outside of the optical-electrical composite flexible circuit substrate 10. Specifically, an opening 14d may be formed in the mounting region 22 so as to reach the electrical circuit 14 from a surface of the substrate 16 located away from the optical circuit 13. By doing so, although the electrical circuit 14 cannot be electrically connected to components as it is if the electrical circuit 14 is present at the position that includes the neutral surface 31 or at the position near the neutral surface, the connecting portion 14a formed by the opening 14d allows the electrical circuit 14 to be electrically connected to components. A method of forming the opening 14d is not particularly limited as long as it is possible to form an opening that reaches the electrical circuit 14 from the surface of the substrate 16 located away from the optical circuit 13. Specifically, a laser irradiation method, a chemical etching method, and the like can be used. Examples of a laser beam include an ultraviolet laser beam such as a UV-YAG laser beam and an infrared laser beam such as $CO_2$ laser. Examples of the chemical etching method include an etching method that uses hydrazine-based etching solution. Specifically, when a polyimide substrate is used as the substrate, an etching method that uses TPE3000 (product of Toray Engineering Co., Ltd.) as an etching solution can be used.

The optical-electrical composite flexible circuit substrate 10 includes a second insulating layer 18 such as a coverlay layer that is formed on a side of the optical circuit 13 located away from the electrical circuit 14 with the adhesive layer 17 interposed.

The optical circuit 13 is not particularly limited as long as the optical circuit 13 can be provided in the optical-electrical composite wiring substrate. Specifically, the same optical circuit as used in the above-described embodiments can be used. More specifically, the optical circuit 13 includes a core portion 11 and a cladding layer 12 that covers the core portion 11. The core portion 11 includes an inclined surface 11a. Further, a metal layer 23 may be formed on the inclined surface 11a in order to increase reflectivity of light. Moreover, this inclined surface is formed in the mounting region 22.

In addition, the position of the electrical circuit 14 is not particularly limited to the position shown in FIGS. 9A and 9B as long as the electrical circuit 14 is located closer to the optical circuit 13 than the base member 15 as described above. Moreover, as shown in FIGS. 10A and 10B, the position of the electrical circuit 14 in the bending region 21 in the width direction of the optical-electrical composite flexible circuit substrate 10 may not overlap the position of the optical circuit 13 in the width direction of the optical-electrical composite flexible circuit substrate 10.

Figure 10A:
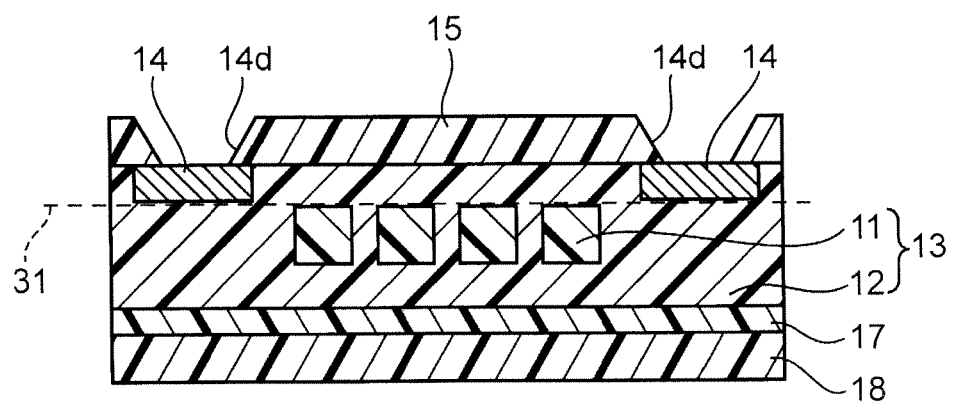
FIGS. 10A and 10B are schematic cross-sectional views showing an optical-electrical composite flexible circuit substrate according to another embodiment of the present invention.
Figure 10B:
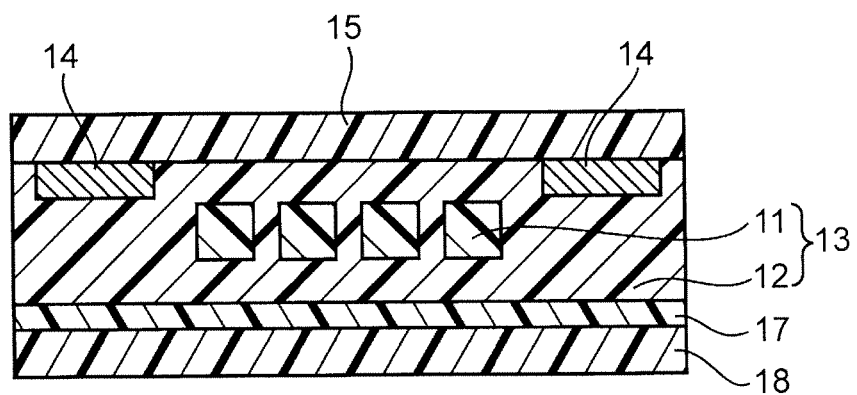

FIGS. 10A and 10B are schematic cross-sectional views showing an optical-electrical composite flexible circuit substrate according to another embodiment of the present invention. FIG. 10A is a schematic cross-sectional view in the mounting region, of the optical-electrical composite flexible circuit substrate. FIG. 10B is a schematic cross-sectional view in the bending region, of the optical-electrical composite flexible circuit substrate.

Figure 11A:
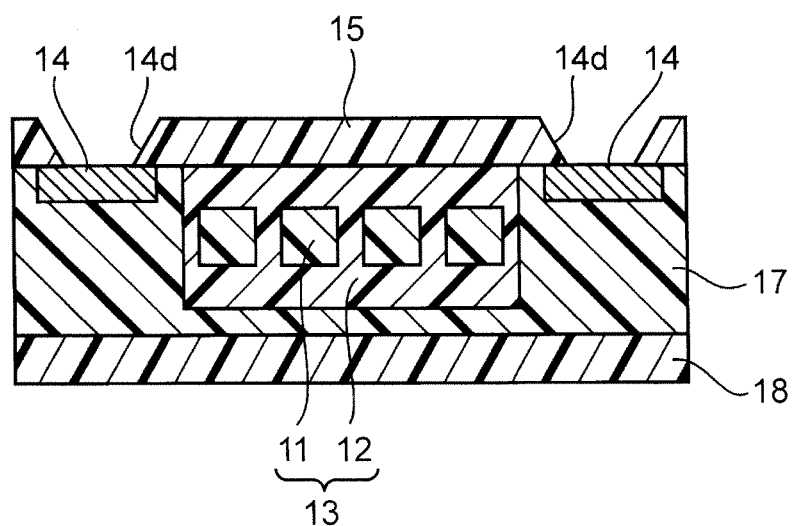
FIGS. 11A and 11B are schematic cross-sectional views showing an optical-electrical composite flexible circuit substrate according to another embodiment of the present invention.
Figure 11B:
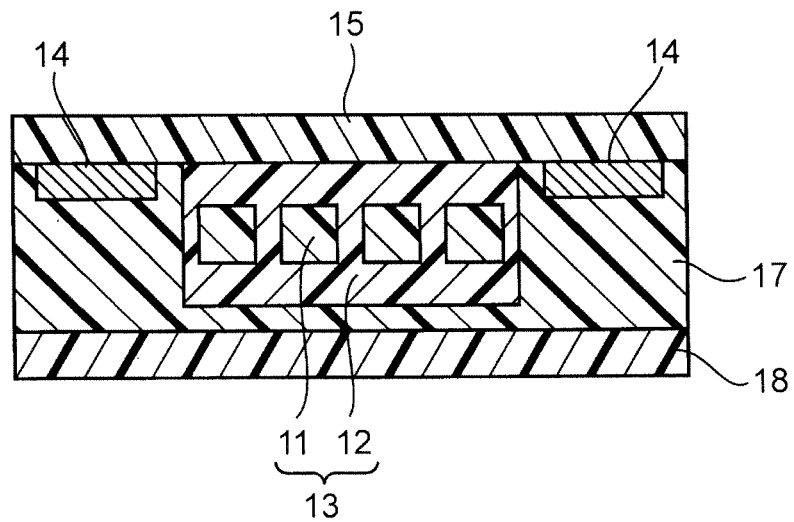

In addition, the electrical circuit 14 may be in contact with the optical circuit 13 as shown in FIGS. 9A, 9B, 10A, and 10B, and may not be in contact with the optical circuit 13 as shown in FIGS. 11A and 11B. Moreover, as shown in FIGS. 11A and 11B, the optical circuit 13 obtained by forming the cladding layer 12 so as to surround the core portion 11 may be covered with the adhesive layer 17 for adhesively bonding the coverlay layer 18. In this case, a thick adhesive layer capable of covering the optical circuit 13 is used as the adhesive layer 17. By doing so, the electrical circuit 14 can be covered by the adhesive layer 17 for adhesively bonding the coverlay layer 18. By covering the electrical circuit 14 with the adhesive layer 17 in this manner, the electrical circuit 14 and the optical circuit 13 can both be disposed at the position that includes the neutral surface or at the position near the neutral surface, and sealing properties of the electrical circuit 14 can be improved further.

FIGS. 11A and 11B are schematic cross-sectional views showing an optical-electrical composite flexible circuit substrate according to another embodiment of the present invention. FIG. 11A is a schematic cross-sectional view in the mounting region, of the optical-electrical composite flexible circuit substrate. FIG. 11B is a schematic cross-sectional view in the bending region, of the optical-electrical composite flexible circuit substrate.

Next, a method of manufacturing the optical-electrical composite flexible circuit substrate will be described. In this example, a method of manufacturing the optical-electrical composite flexible circuit substrate shown in FIGS. 1A, 1B, 2A, and 2B will be described as an example.

Figure 12A:
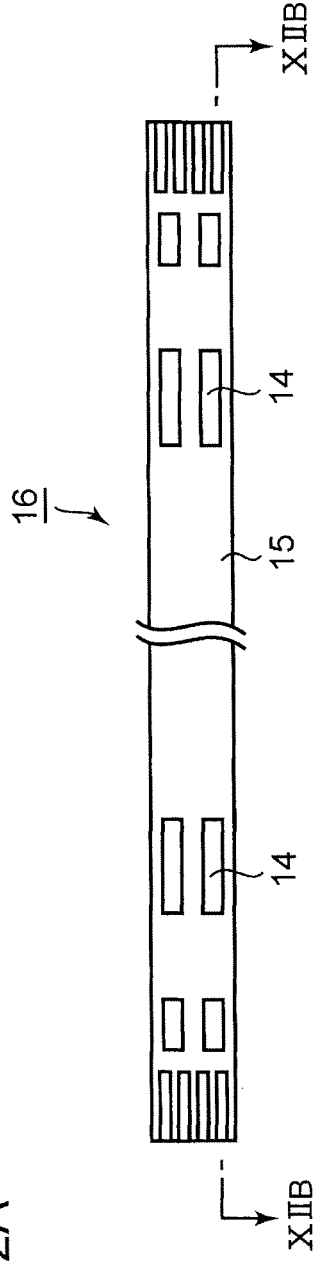
FIGS. 12A to 12C are schematic views showing a substrate that includes an electrical circuit and a base member.
Figure 12B:
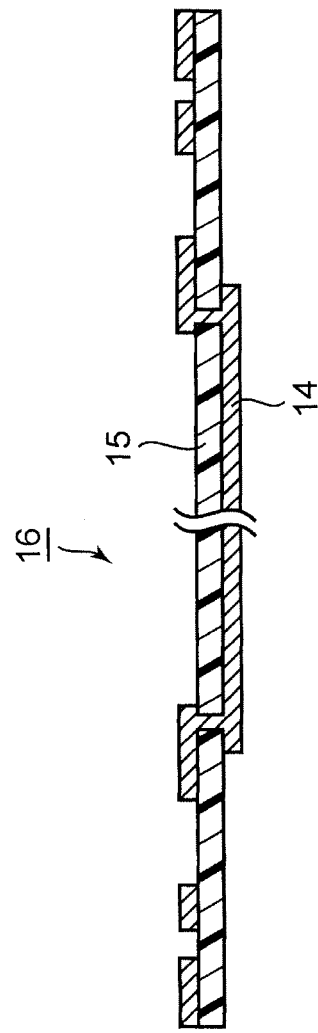
Figure 12C:
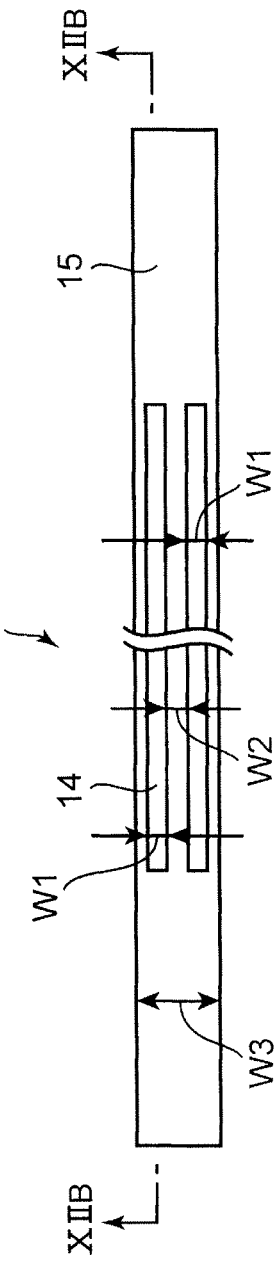

First, a substrate (that is, an electrical flexible wiring substrate) that includes an electrical circuit and a base member (first insulating layer) as shown in FIGS. 12A to 12C is prepared. In practice, after an optical circuit is formed using one in which a plurality of substrates shown in FIGS. 12A to 12C is arranged, the substrate is cut to obtain the optical-electrical composite flexible circuit substrate. Thus, the electrical flexible wiring substrate shown in FIGS. 12A to 12C is a portion that corresponds to a substrate portion of an optical-electrical composite flexible circuit substrate which is a final product.

FIGS. 12A to 12C are schematic views showing a substrate 16 that includes an electrical circuit 14 and a base member (first insulating layer) 15. FIG. 12A is a schematic view (that is, a top view) showing the substrate as seen from the side where the optical circuit is not formed. FIG. 12B is a schematic cross-sectional view along line XIIB-XIIB, of the substrate shown in FIG. 12A. FIG. 12C is a schematic view (that is, a bottom view) showing the substrate as seen from the side where the optical circuit is formed.

The substrate 16 used for manufacturing the optical-electrical composite flexible circuit substrate includes the electrical circuit 14 and the base member (first insulating layer) 15 as shown in FIGS. 12A to 12C. The electrical circuit 14 is formed such that the base member 15 is interposed between a region that corresponds to the bending region 21 of the optical-electrical composite flexible circuit substrate 10 and a region that corresponds to the mounting region 22 of the optical-electrical composite flexible circuit substrate 10. These regions are formed so as to be electrically connected through a through-hole. A width W1 of the electrical circuit is not particularly limited, and preferably, is between approximately 0.2 mm and 0.4 mm. Specifically, the width W1 may be approximately 0.3 mm. Moreover, a distance W2 between electrical circuits is not particularly limited, and preferably, is between approximately 0.1 mm and 0.3 mm. Specifically, the distance W2 may be approximately 0.2 mm. Moreover, a width W3 of the substrate is a width required for the optical-electrical composite flexible circuit substrate which is the final product. Specifically, the width W3 is preferably between approximately 1.5 mm and 3 mm. More specifically, the width W3 may be approximately 2 mm.

The method of manufacturing the optical-electrical composite flexible circuit substrate is not particularly limited as long as the method can form the optical circuit on a surface of the substrate 16 closer to the side on which the electrical circuit present in the region corresponding to the bending region 21 of the optical-electrical composite flexible circuit substrate 10 is formed. Specifically, the following method can be used.

FIGS. 13A to 13I are schematic views for explaining a method of manufacturing the optical-electrical composite wiring substrate. Steps that are generally used as steps for forming an optical circuit can be used as the respective steps of the method.

According to a method of manufacturing an optical circuit according to a first embodiment of the present invention, first, a substrate 16 that includes an electrical circuit 14 and a base member (first insulating layer) 15 as shown in FIG. 13A is prepared. The substrate 16 is the same as that shown in FIGS. 12A to 12C.

Subsequently, as shown in FIG. 13B, a temporary substrate 42 is laminated on a surface of the substrate 16 opposite to a surface, on which an electrical circuit present in a region corresponding to the bending region 21 of the optical-electrical composite flexible circuit substrate 10 is formed with an adhesive layer 41 interposed. The temporary substrate 42 is one that is detached after the optical circuit 13 is formed and is not particularly limited as long as it can maintain its shape even when it is damaged. Moreover, the adhesive layer 41 is not particularly limited as long as it can adhesively bond the substrate 16 and the temporary substrate 42. Specifically, a double-sided adhesive tape can be used, for example.

Subsequently, as shown in FIG. 13C, a first cladding layer 12a is formed on a surface of the substrate 16 located closer to the side on which the electrical circuit present in the region corresponding to the bending region 21 of the optical-electrical composite flexible circuit substrate 10 is formed.

A method of forming the first cladding layer 12a is not particularly limited as long as the method can form the first cladding layer 12a on the surface of the substrate 16. Specifically, the following method can be used, for example. A first exemplary method involves attaching a resin film made from a curable resin material having a predetermined refractive index for forming the first cladding layer 12a to the surface of the substrate 16 and curing the resin film. A second exemplary method involves applying solution made from a curable resin material for forming the first cladding layer 12a and curing the curable resin material. A third exemplary method involves applying varnish made from a curable resin material for forming the first cladding layer 12a and curing the varnish. When the first cladding layer 12a is formed, it is preferable to perform plasma treatment or the like on the surface of the substrate 16 in advance in order to enhance adhesion.

The following method can be used, for example, as a more specific method of attaching the resin film for forming the first cladding layer 12a and curing the resin film. First, a resin film made from a curable resin is placed so as to overlap the surface of the substrate 16 and is attached by hot press, or a resin film made from a curable resin is attached to the surface of the substrate 16 using a transparent adhesive agent. The attached resin film is cured by irradiating the same with energy rays such as light or heating the same.

In addition, the following method can be used, for example, as a more specific method of applying a liquid curable resin material or varnish made from a curable resin material for forming the first cladding layer 12a and curing the liquid curable resin material or the varnish. First, a liquid curable resin material or varnish made from a curable resin material is applied to the surface of the substrate 16 using a spin coating method, a bar coating method, or a dip coating method. The applied liquid curable resin material or the varnish made from the curable resin material is cured by irradiating the same with energy rays such as light or heating the same.

As the curable resin material for forming the first cladding layer 12a, a material of which the refractive index at a transmission wavelength of propagation light is lower than the material of the core portion 11 formed later is used. Specifically, the refractive index at the transmission wavelength may be between approximately 1.5 and 1.55, for example. Examples of such a curable resin material include an epoxy resin, an acrylic resin, a polycarbonate resin, a polyimide resin, and the like having such a refractive index.

In addition, the curable resin material used for forming the first cladding layer 12a is not particularly limited as long as the material after curing satisfies the refractive index conditions and can be used as the cladding layer. Specifically, materials that are cured with energy rays such as light or heat can be used, for example, as described above. More specifically, photosensitive materials can be used, for example. Moreover, a specific example of the resin film made from the curable resin material includes a dry film (so-called a dry film photoresist (simply referred to as a "photosensitive film")) obtained by applying a semi-cured photosensitive polymer material to a polyethylene terephthalate (PET) film or the like.

The thickness of the first cladding layer 12a is not particularly limited. Specifically, the thickness is preferably between approximately 5 μm and 15 μm, for example.

Subsequently, as shown in FIG. 13D, the core portion 11 is formed on the first cladding layer 12a.

In this case, first, a core material layer made from a photosensitive material is formed on an outer surface of the first cladding layer 12a.

Here, the photosensitive material is a material of which the solubility in a solution used for developing described later changes of the portion irradiated with energy rays. Specifically, materials which are rarely soluble in a solution used for developing described later before being irradiated with energy rays whereas the materials are easily soluble after being irradiated with energy rays can be used, for example. As another example, materials which are easily soluble in a solution used for developing described later before being irradiated with energy rays whereas the materials are rarely soluble after being irradiated with energy rays can be used, for example. A specific example of the photosensitive material includes a photosensitive polymer material. Moreover, the energy rays are not particularly limited as long as it is possible to change solubility. Specifically, ultraviolet rays are preferably used because they are easy to handle. In general, a photosensitive polymer material of which the solubility of the portion irradiated with ultraviolet rays changes is preferably used as the photosensitive material. More specifically, a photosensitive polymer material in which the portion irradiated with ultraviolet rays is cured and becomes rarely soluble in a solution used for developing described later is preferably used.

A method of forming the core material layer is not particularly limited as long as the method can form a core material layer. Specifically, the following method can be used, for example. A first exemplary method involves attaching a resin film (photosensitive film) made from a photosensitive polymer material having a predetermined refractive index for forming the core material layer to an outer surface of the first cladding layer 12. A second exemplary method involves applying a liquid photosensitive polymer material for forming the core material layer. A third exemplary method involves applying varnish made from a photosensitive polymer material for forming the core material layer and drying the varnish. When the core material layer is formed, it is also preferable to perform plasma treatment or the like on the outer surface of the first cladding layer 12 in advance in order to activate the outer surface to enhance adhesion.

The following method can be used, for example, as a more specific method of attaching the resin film for forming the core material layer. A resin film made from a curable resin is placed so as to overlap the outer surface of the first cladding layer 12a and is attached by hot press.

In addition, the following method can be used, for example, as a more specific method of applying a liquid curable resin material or varnish made from a curable resin material for forming the core material layer. A liquid curable resin material or varnish made from a curable resin material is applied to the outer surface of the first cladding layer 12a using a spin coating method, a bar coating method, or a dip coating method, and is then dried as necessary.

An example of the resin film made from the photosensitive polymer material includes a dry film obtained by applying a semi-cured photosensitive polymer material to a polyethylene terephthalate (PET) film or the like. Such a dry film is generally protected by a protective film.

As the photosensitive polymer material for forming the core material layer, a material of which the refractive index at a transmission wavelength of propagation light is lower than the material of the first cladding layer 12a is used. Specifically, the refractive index at the transmission wavelength may be between approximately 1.55 and 1.6, for example. Examples of the photosensitive polymer material for forming the core material layer include a photosensitive material which has such a refractive index and which includes a resin component such as an epoxy resin, an acrylic resin, a polycarbonate resin, or a polyimide resin. Among these materials, a bisphenol-type epoxy resin is particularly preferred. Thus, as the photosensitive polymer material for forming the core material layer, a resin composition that contains a bisphenol-type epoxy resin and a photo-cation curing agent is preferable from the facts that a waveguide having high heat resistance can be obtained and that the core material layer can be combined with a printed substrate or the like. From the perspective of adhesion between the core material layer and the first cladding layer 12a, the photosensitive polymer material for forming the core material layer is preferably the same system as the curable resin material for forming the first cladding layer 12a.

The thickness of the core material layer is not particularly limited. Specifically, the thickness is preferably between approximately 20 μm and 100 μm, for example.

A heat treatment may be performed on the core material layer before the core material layer is exposed to light to be cured or the like. By doing so, unevenness, bubbles, voids, and the like on the surface of the core material layer are removed and flattened. A heat treatment temperature is preferably set such that the core material layer has such a viscosity that unevenness, bubbles, voids, and the like on the surface of the core material layer are removed and flattened, and the temperature is appropriately selected according to the type of the curable resin material used for forming the core material layer. Moreover, a heat treatment time is preferably between approximately 10 minutes and 30 minutes from the perspective that the effect of removing and flattening unevenness, bubbles, voids, and the like on the surface of the core material layer is sufficiently obtained. Heat treatment means is not particularly limited, and a method of performing treatment in an oven set to a predetermined temperature and a method of heating using a hot plate can be used.

Subsequently, the core material layer is irradiated with an exposure beam with a photomask interposed to form a pattern of a predetermined shape on the core material layer. The exposure method is not particularly limited as long as the method can expose the photosensitive material to light having such a wavelength and intensity that the photosensitive material is transformed (cured or the like) with the light. Specifically, a method of using energy rays such as ultraviolet rays as the exposure beam can be used, for example. Ultraviolet rays are preferably used from the fact that they are easy to handle. Moreover, an optional exposure method such as a contact exposure method of performing exposure by placing a photomask in contact with the surface of the core material layer or a projection exposure method of performing exposure by placing a photomask to be held at a predetermined distance so as not to make contact with the outer surface of the core material layer can be used.

In addition, although the exposure condition is appropriately selected according to the type of the photosensitive material, an exposure condition where radiation density of 500 mJ/cm$^2$ to 3500 mJ/cm$^2$ is obtained using an ultrahigh-pressure mercury lamp is selected, for example.

It is also effective to perform post-cure using heat after performing the exposure from the perspective of ensuring curing. As the post-cure condition, a temperature between approximately 80° C. and 160° C. and a time between approximately 20 minutes and 120 minutes are preferable. However, the post-cure condition is not particularly limited to this range, and it is naturally important to optimize the condition according to the photosensitive material.

Subsequently, a developing process is performed whereby the core portion 11 as shown in FIG. 13D is formed.

The developing process for forming the core portion 11 is a step of washing a non-exposed portion of the core material layer formed from a positive photosensitive material and an exposed portion of the core material layer formed from a negative photosensitive material using a developing solution to thereby remove an unnecessary portion. Examples of the developing solution used herein include acetone, isopropyl alcohol, toluene, ethylene glycol, or a mixture in which these solutions are mixed in predetermined proportions. An aqueous developing solution as disclosed in Japanese Patent Application Laid-open No. 2007-292964 can be preferably used, for example. Examples of the developing method include a method of spraying a developing solution using a spray, method of using ultrasonic cleaning, and other methods.

Subsequently, as shown in FIG. 13E, an inclined surface 11a for reflecting light is formed on the core portion 11. A method thereof is not particularly limited as long as the method can form the above-described inclined surface. A specific method of forming the inclined surface includes a method of cutting using a dicing blade, a laser ablation method, and other methods. More specifically, a method of cutting the core portion 11 using a blade in which one surface of a blade edge is parallel to a plane direction of the blade, and the other surface of the blade edge has a predetermined angle (for example, 45°) with respect to the plane direction of the blade can be used, for example. The blade is a disk-shaped rotating blade in which a blade edge is present in its circumferential portion, and a dicing blade or the like is used, for example.

When the core portion 11 is cut using a blade, the core portion 11 may be cut while softening the same by heating the substrate 16, the blade, or the like as necessary. When the cutting is performed, the blade edge of the blade may reach the first cladding layer 12a or may not reach the same.

Subsequently, as shown in FIG. 13F, a metal layer 23 is formed on the inclined surface 11a formed in the above-described manner. A method of forming the metal layer is not particularly limited, and an existing method can be used. Specifically, a deposition method such as a vacuum deposition method, a sputtering method, or a nano-paste method can be used, for example.

The thickness of the metal layer 23 is not particularly limited as long as the metal layer can reflect light, and the thickness may be approximately 1000 Å, for example.

Subsequently, as shown in FIG. 13G, a second cladding layer 12b is formed so as to bury the core portion 11 formed in the above-described manner, whereby an optical circuit that includes the core portion 11 and the cladding layer 12 that covers the core portion is formed.

A method of forming the second cladding layer 12b is not particularly limited. Specifically, the following method can be used, for example. A first exemplary method involves applying a liquid curable resin material for forming the second cladding layer 12b so as to bury the core portion 11 and curing the curable resin material with energy rays such as light or heat. A second exemplary method involves applying varnish made from a curable resin material for forming the second cladding layer 12b and curing the varnish with energy rays such as light or heat. A third exemplary method involves attaching a resin film made from a curable resin material for forming the second cladding layer 12b and curing the resin film with energy rays such as light or heat.

The curable resin material for forming the second cladding layer 12b is not particularly limited as long as the curable resin material has a refractive index lower than the material of the core portion 11 at a transmission wavelength of propagation light. In general, the same curable resin material as the material used for forming the first cladding layer 12a is used.

In addition, although the thickness of the second cladding layer 12b is not particularly limited, the second cladding layer 12b on the core portion 11 preferably has approximately the same thickness as the first cladding layer 12a.

The optical circuit is formed of the core portion 11 and the cladding layer 12 (the first and second cladding layers 12a and 12b) that covers the core portion 11, and the core portion 11 has a higher refractive index than the cladding layer 12 and is configured such that light propagating therethrough is confined in the core due to total-reflection. Such an optical circuit is generally formed as a multi-mode waveguide. Although the core portion 11 of the optical circuit ideally has a rectangular shape having a size of 20 μm to 100 μm, the thicknesses of the first lower cladding layer 12a and the second upper cladding layer 12b excluding the thickness of the layer that includes the core portion are ideally between 5 μm and 15 μm, and a refractive index difference between the core portion and the cladding layer is ideally between approximately 0.5% and 3%, the present invention is not limited to this.

Subsequently, as shown in FIG. 13H, a second insulating layer 18 such as a coverlay layer is laminated on the second cladding layer 12b with an adhesive layer 17 interposed. Specifically, a method of laminating a coverlay layer having an adhesive layer after performing an oxygen plasma treatment on the second cladding layer 12b can be used. The insulating layer 18 is not particularly limited, and one that is generally used as a coverlay layer can be used. Moreover, the adhesive layer 17 is not particularly limited as long as the insulating layer 18 can be adhesively bonded to the second cladding layer 12b.

Subsequently, as shown in FIG. 13I, the temporary substrate 42 is separated, the adhesive layer 41 as well as the temporary substrate 42 are removed, and a portion of the electrical circuit 14 exposed to the outside, on which components are not mounted, is coated with a solder resist layer 19 in order to prevent corrosion. By doing so, the optical-electrical composite flexible circuit substrate as shown in FIGS.

1A, 1B, 2A, and 2B is obtained. A general coating method can be used as a coating method of the solder resist layer 19.

The following method can be used as another method of manufacturing the optical-electrical composite flexible circuit substrate. FIGS. 14A to 14L are schematic views for explaining another method of manufacturing the optical-electrical composite wiring substrate. In this example, a method of manufacturing the optical-electrical composite flexible circuit substrate shown in FIGS. 7A and 7B will be described as an example. Steps that are generally used as steps for forming an optical circuit can be used as the respective steps of the method, and the same steps as those described above will not be described.

First, as shown in FIGS. 14A and 14B, a temporary substrate 42 is laminated on a surface of a substrate 16 including an electrical circuit 14 and a base member (first insulating layer) 15 as shown in FIGS. 12A to 12C, opposite to a surface, on which the electrical circuit 14 present in a region corresponding to the bending region 21 of the optical-electrical composite flexible circuit substrate 10 is formed, with an adhesive layer 41 interposed.

Subsequently, as shown in FIG. 14C, a first cladding layer 12a is formed on a surface of the substrate 16 located closer to the side on which the electrical circuit present in the region corresponding to the bending region 21 of the optical-electrical composite flexible circuit substrate 10 is formed. In this case, the first cladding layer 12a is formed on a partial surface of the substrate 16 as shown in FIG. 14C rather than forming on the entire surface. Specifically, the first cladding layer 12a is formed so as to cover only the electrical circuit of the substrate 16, present in the region corresponding to the bending region 21 of the optical-electrical composite flexible circuit substrate 10. That is, when the first cladding layer 12a, exposure is performed using a mask having a predetermined shape when a curable resin material for forming the first cladding layer 12a is cured. FIG. 14D is a cross-sectional view along line D-D, of the laminated structure shown in FIG. 14C. In this manner, the first cladding layer 12a is formed so as to cover only the electrical circuit of the substrate 16, present in the region corresponding to the bending region 21 of the optical-electrical composite flexible circuit substrate 10.

Subsequently, as shown in FIGS. 14E and 14F, a core portion 11 is formed on the first cladding layer 12a. FIG. 14F is a cross-sectional view along line F-F, of the laminated structure shown in FIG. 14E.

Subsequently, as shown in FIG. 14G, an inclined surface 11a for reflecting light is formed on the core portion 11.

Subsequently, as shown in FIG. 14H, a metal layer 23 is formed on the inclined surface 11a formed in the above-described manner.

Subsequently, as shown in FIG. 14I, a second cladding layer 12b is formed so as to bury the core portion 11 formed in the above-described manner, whereby an optical circuit that includes the core portion 11 and the cladding layer 12 that covers the core portion. In this case, the second cladding layer 12b is formed on the first cladding layer 12a. That is, when the second cladding layer 12b is formed, exposure is performed using a mask having a predetermined shape when a curable resin material for forming the second cladding layer 12b is cured. FIG. 14J is a cross-sectional view along line J-J, of the laminated structure shown in FIG. 14I. In this manner, the optical circuit 13 is formed on the electrical circuit of the substrate 16, present in the region corresponding to the bending region 21 of the optical-electrical composite flexible circuit substrate 10.

Subsequently, as shown in FIG. 14K, a second insulating layer 18 such as a coverlay layer is laminated on the substrate 16, on which the optical circuit 13 is formed, with an adhesive layer 17 interposed. In this case, a thick adhesive layer capable of burying the optical circuit 13 is used as the adhesive layer 17.

Finally, as shown in FIG. 14L, the temporary substrate 42 is separated, the adhesive layer 41 as well as the temporary substrate 42 are removed, and a portion of the electrical circuit 14 exposed to the outside, on which components are not mounted, is coated with a solder resist layer 19 in order to prevent corrosion. By doing so, the optical-electrical composite flexible circuit substrate as shown in FIGS. 7A and 7B is obtained.

The following method can be used as another method of manufacturing the optical-electrical composite flexible circuit substrate. In this example, a method of manufacturing the optical-electrical composite flexible circuit substrate shown in FIGS. 8A, 8B, 9A, and 9B will be described as an example.

Figure 15A:
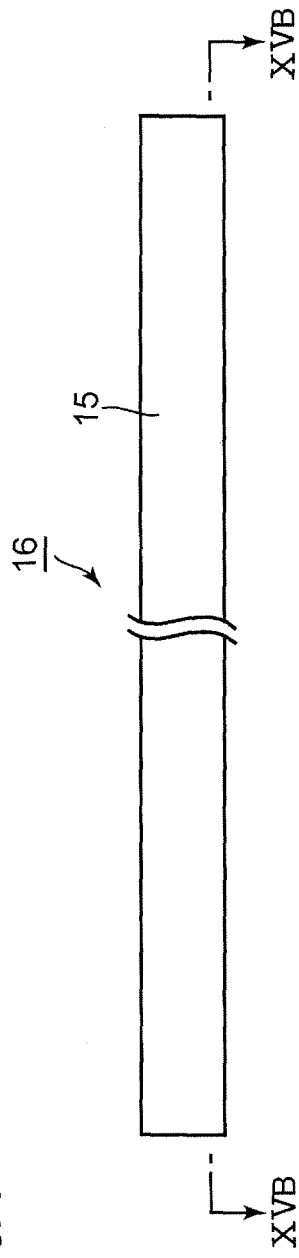
FIGS. 15A to 15C are schematic views showing a substrate that includes an electrical circuit and a base member.
Figure 15B:
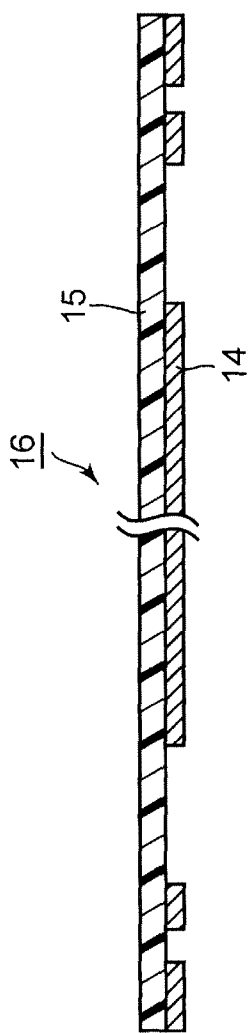
Figure 15C:
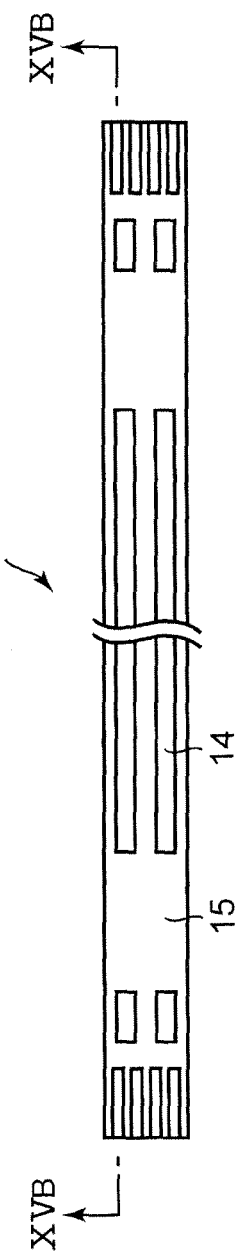

First, a substrate (that is, an electrical flexible wiring substrate) that includes an electrical circuit and a base member (first insulating layer) as shown in FIGS. 15A to 15C is prepared. In practice, after an optical circuit is formed using one in which a plurality of substrates shown in FIGS. 15A to 15C is arranged, the substrate is cut to obtain the optical-electrical composite flexible circuit substrate. Thus, the electrical flexible wiring substrate shown in FIGS. 15A to 15C is a portion that corresponds to a substrate portion of an optical-electrical composite flexible circuit substrate which is a final product.

FIGS. 15A to 15C are schematic views showing a substrate 16 that includes an electrical circuit 14 and a base member (first insulating layer) 15. FIG. 15A is a schematic view (that is, a top view) showing the substrate as seen from the side where the optical circuit is not formed. FIG. 15B is a schematic cross-sectional view along line XVB-XVB, of the substrate shown in FIG. 15A. FIG. 15C is a schematic view (that is, a bottom view) showing the substrate as seen from the side where the optical circuit is formed.

The substrate 16 used for manufacturing the optical-electrical composite flexible circuit substrate includes the electrical circuit 14 and the base member (first insulating layer) 15 as shown in FIGS. 15A to 15C. The electrical circuit 14 is formed on the same surface of the base member 15 in a region that corresponds to the bending region 21 of the optical-electrical composite flexible circuit substrate 10 and a region that corresponds to the mounting region 22 of the optical-electrical composite flexible circuit substrate 10.

The method of manufacturing the optical-electrical composite flexible circuit substrate is not particularly limited as long as the method can form the optical circuit on a surface of the substrate 16 on which the electrical circuit is formed. Specifically, the following method can be used.

FIGS. 16A to 16I are schematic views for explaining another method of manufacturing the optical-electrical composite wiring substrate. Steps that are generally used as steps for forming an optical circuit can be used as the respective steps of the method, and the same steps as those described above will not be described.

First, as shown in FIGS. 16A and 16B, a temporary substrate 42 is laminated on a surface of a substrate 16 including an electrical circuit 14 and a base member (first insulating layer) 15 as shown in FIGS. 15A to 15C, opposite to a surface, on which the electrical circuit 14 is formed, with an adhesive layer 41 interposed. Subsequently, as shown in FIG. 16C, a first cladding layer 12a is formed on a surface of the substrate 16 closer to the side where the electrical circuit 14 is formed.

Subsequently, as shown in FIG. 16D, a core portion 11 is formed on the first cladding layer 12a. Subsequently, as shown in FIG. 16E, an inclined surface 11a for reflecting light is formed on the core portion 11. Subsequently, as shown in FIG. 16F, a metal layer 23 is formed on the inclined surface 11a. Subsequently, as shown in FIG. 16G, a second cladding layer 12b is formed so as to bury the formed core portion 11. By doing so, an optical circuit that includes the core portion 11 and the cladding layer 12 that covers the core portion is formed. Subsequently, as shown in FIG. 16H, a second insulating layer 18 such as a coverlay layer is laminated on the substrate 16, on which the optical circuit 13 is formed, with an adhesive layer 17 interposed. Finally, as shown in FIG. 16I, the temporary substrate 42 is separated, the adhesive layer 41 as well as the temporary substrate 42 are removed, and an opening 14a that reaches the electrical circuit 14 is formed on the surface of the substrate 16 opposite to the surface, on which the electrical circuit 14 is formed, is formed. By doing so, the optical-electrical composite flexible circuit substrate as shown in FIGS. 8A, 8B, 9A, and 9B is obtained.

Figures 17A, 17B:
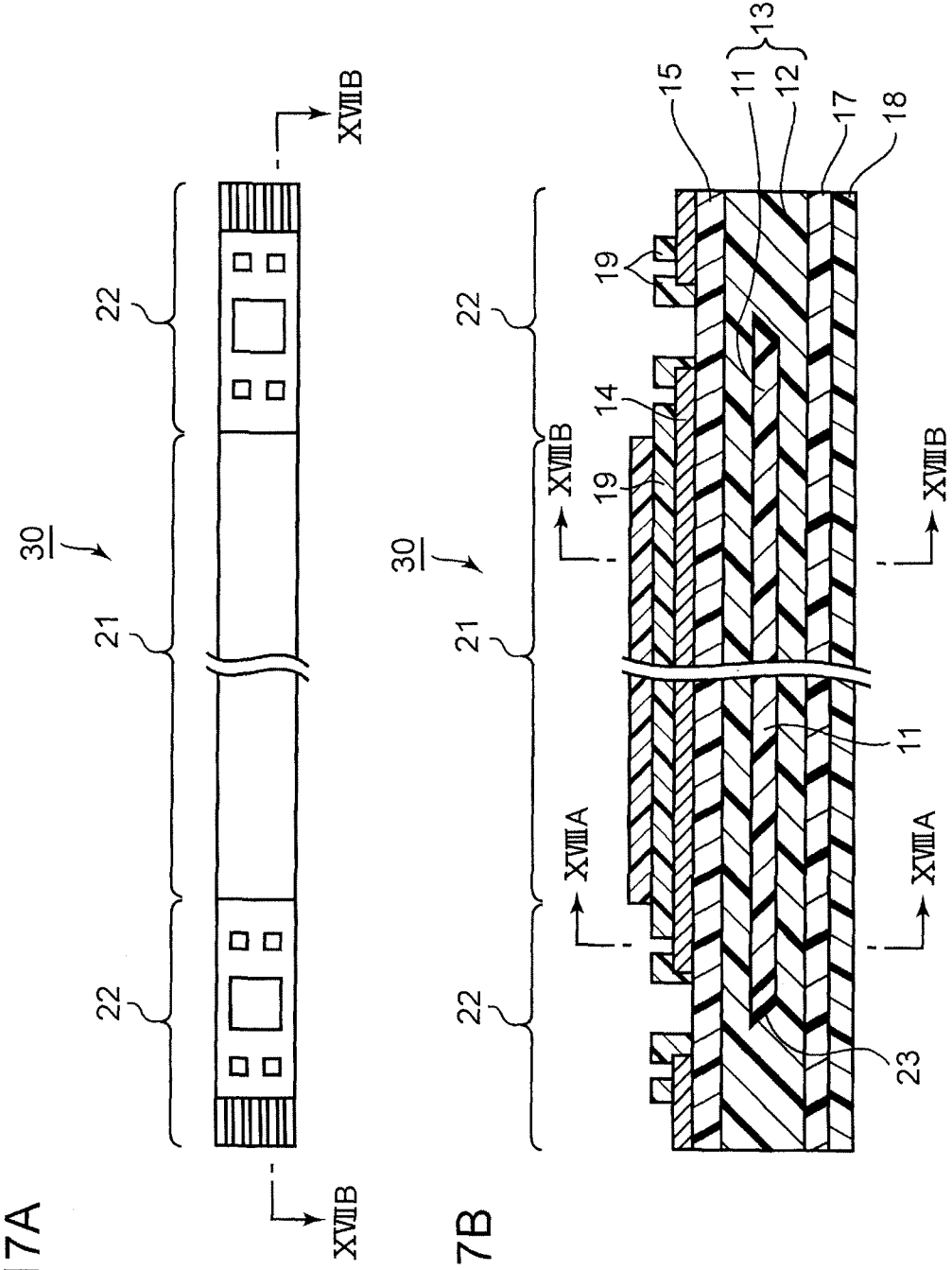
FIGS. 17A and 17B are schematic views showing an optical-electrical composite flexible circuit substrate when an electrical circuit is located away from the neutral surface.
Figure 18A:
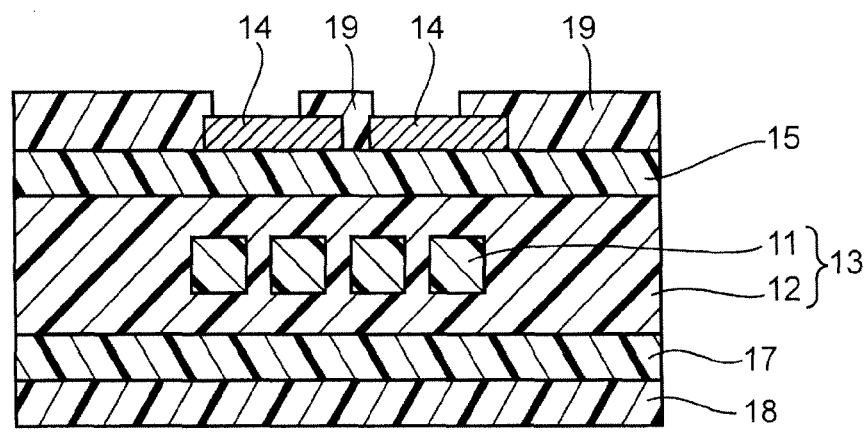
FIGS. 18A and 18B are schematic cross-sectional views of an optical-electrical composite flexible circuit substrate shown in FIGS. 17A and 17B.
Figure 18B:
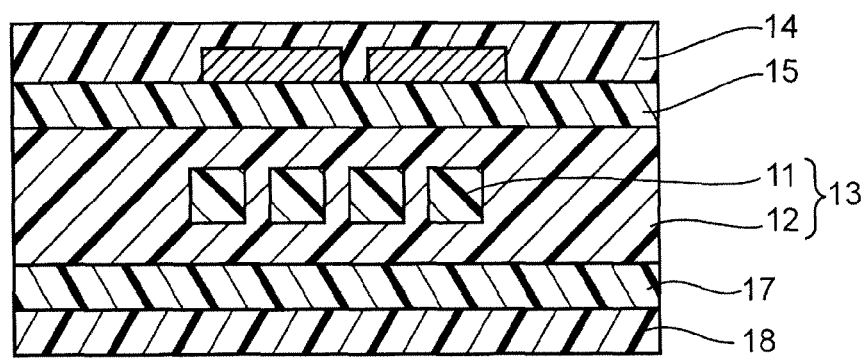

Next, a case where at least one of the electrical circuit and the optical circuit is away from the neutral surface unlike the optical-electrical composite flexible circuit substrate described above in which the electrical circuit and the optical circuit are disposed at the position that includes the neutral surface or at the position near the neutral surface will be described. Specifically, an optical-electrical composite flexible circuit substrate shown in FIGS. 17A, 17B, 18A, and 18B is an example thereof. FIGS. 17A and 17B are schematic views showing an optical-electrical composite flexible circuit substrate when an electrical circuit is located away from the neutral surface. FIG. 17A is a schematic view (that is, a top view) showing the optical-electrical composite flexible circuit substrate as seen from the electrical circuit. FIG. 17B is a schematic cross-sectional view along line XVIIB-XVIIB, of the optical-electrical composite flexible circuit substrate shown in FIG. 17A. FIGS. 18A and 18B are schematic cross-sectional views of the optical-electrical composite flexible circuit substrate shown in FIGS. 17A and 17B. FIG. 18A is a schematic cross-sectional view along line XVIIIA-XVIIIA, of the optical-electrical composite flexible circuit substrate shown in FIG. 17B. FIG. 18B is a schematic cross-sectional view along line XVIIIB-XVIIIB, of the optical-electrical composite flexible circuit substrate shown in FIG. 17B.

As shown in FIGS. 17A, 17B, 18A, and 18B, an optical-electrical composite flexible circuit substrate 30 has a configuration in which a substrate 16 (that is, an electrical flexible wiring substrate 16) includes a base member (first insulating layer) 15 and an electrical circuit 14 formed on one surface of the base member 15, and an optical circuit 13 is formed on a surface of the substrate 16 opposite to the side on which the electrical circuit 14 is formed. When the substrate 16 shown in FIGS. 15A to 15C is used, it is a common practice to form the optical circuit 13 in this manner in order to realize electrical connection to the outside. However, in the optical-electrical composite flexible circuit substrate 30 having such a configuration, the base member 15 is interposed between the electrical circuit 14 and the optical circuit 13. Due to this reason, even if the electrical circuit 14 is located near the neutral surface, the optical circuit 13 is located away from the neutral surface. Moreover, even if the optical circuit 13 is located near the neutral surface, the electrical circuit 14 is located away from the neutral surface. Thus, it is difficult to sufficiently increase bending resistance.

Such an optical-electrical composite flexible circuit substrate 30 can be manufactured when the optical circuit 13 is formed on the surface of the electrical flexible wiring substrate 16 opposite to the side on which the electrical circuit 14 is formed according to a general method. Specifically, the following method can be used.

FIGS. 19A to 19I are schematic views for explaining a method of manufacturing the optical-electrical composite wiring substrate shown in FIGS. 17A and 17B. Steps that are generally used as steps for forming an optical circuit can be used as the respective steps of the method, and the same steps as those described above will not be described.

First, as shown in FIGS. 19A and 19B, a temporary substrate 42 is laminated on a surface of a substrate 16 including an electrical circuit 14 and a base member (first insulating layer) 15 as shown in FIGS. 15A to 15C, closer to a surface, on which the electrical circuit 14 is formed, with an adhesive layer 41 interposed. Subsequently, as shown in FIG. 19C, a first cladding layer 12a is laminated on the surface of the substrate 16 opposite to the surface, on which the electrical circuit 14 is formed. Subsequently, as shown in FIG. 19D, a core portion 11 is formed on the first cladding layer 12a. Subsequently, as shown in FIG. 19E, an inclined surface 11a for reflecting light is formed on the core portion 11. Subsequently, as shown in FIG. 19F, a metal layer 23 is formed on the inclined surface 11a. Subsequently, as shown in FIG. 19G, a second cladding layer 12b is formed so as to bury the formed core portion 11. By doing so, an optical circuit that includes the core portion 11 and the cladding layer 12 that covers the core portion is formed. Subsequently, as shown in FIG. 19H, a second insulating layer 18 such as a coverlay layer is laminated on the substrate 16, on which the optical circuit 13 is formed, with an adhesive layer 17 interposed. Finally, as shown in FIG. 19I, the temporary substrate 42 is separated, the adhesive layer 41 as well as the temporary substrate 42 are removed, and an opening through which light can pass is formed. By doing so, the optical-electrical composite flexible circuit substrate as shown in FIGS. 17A, 17B, 18A, and 18B is obtained.

As described above, an optical-electrical composite flexible circuit substrate in which an optical circuit and an electrical circuit are disposed at a position that includes a neutral surface when the optical-electrical composite flexible circuit substrate is bent, or at a position near the neutral surface has excellent bending resistance as compared to when at least one of the optical circuit and the electrical circuit is not disposed near the neutral surface when the optical-electrical composite flexible circuit substrate is bent.

PRACTICAL EXAMPLES

Hereinafter, the present invention will be described further in detail with reference to practical examples. The scope of the present invention is not intended to be limited by the practical examples.

First, a method of manufacturing a resin film used for manufacturing an optical-electrical composite flexible circuit substrate according to the present practical example will be described.

(Manufacturing of First Cladding Layer Resin Film)

Composition components including 7 parts by weight of polypropylene glycol glycidyl ether (PG207, product of NSCC Epoxy Manufacturing Co., Ltd.), 25 parts by weight of a liquid hydrogen-added bisphenol-A epoxy resin (YX8000, product of Mitsubishi Chemical Corporation), 20 parts by weight of a solid liquid hydrogen-added bisphenol-A epoxy resin (YL7170, product of Mitsubishi Chemical Corporation), 8 parts by weight of 1,2-epoxy-4-(2-oxiranyl)cyclohexane adduct of 2,2-bis(hydroxymethyl)-1-butanol (EHPE3150, product of Daicel Chemical Industries, Ltd.), 2 parts by weight of a solid bisphenol-A epoxy resin (Epicoat 1006FS, product of Mitsubishi Chemical Corporation), 20 parts by weight of a phenoxy resin (YP50, product of product of NSCC Epoxy Manufacturing Co., Ltd.), 0.5 parts by weight of a photo-cation curing initiator (SP-170, product of ADEKA CORPORATION), 0.5 parts by weight of a heat-cation curing initiator (SI-150L, product of SANSHIN CHEMICAL INDUSTRY, CO., LTD.), and 0.1 parts by weight of a surface conditioner (F470, product of DIC Corporation) are dissolved in a mixture solvent of 30 parts by weight of toluene and 70 parts by weight of methyl ethyl ketone (MEK). The obtained solution was filtered by a membrane filter having a pore size of 1 µm and was subjected to vacuum degassing. By doing so, an epoxy resin varnish was prepared. The prepared varnish was applied to a PET film (A4100, product of TOYOBO CO., LTD.) using a multi-coater of a comma coater head (product of HIRANO TECSEED Co., Ltd.) and was dried to obtain a resin layer having a predetermined thickness. A release film (OPP-MA420, product of Oji Specialty Paper Co., Ltd.) was heat-laminated on the resin layer. By doing so, a first cladding layer resin film was obtained. The thickness of the obtained first cladding layer resin film was 15 µm.

(Manufacturing of Core Resin Film)

Composition components including 8 parts by weight of 3,4-epoxycyclohexenylmethyl-3',4'-epoxycyclohexenecarboxylate (CELLOXIDE 2021P (also called CEL2021P), product of Daicel Chemical Industries, Ltd.), 12 parts by weight of an epoxy resin (1,2-epoxy-4-(2-oxiranyl)cyclohexane adduct of 2,2-bis(hydroxymethyl)-1-butanol, EHPE3150, product of Daicel Chemical Industries, Ltd.), 37 parts by weight of a solid bisphenol-A epoxy resin (Epicoat 1006FS, product of Mitsubishi Chemical Corporation), 15 parts by weight of a 3-functional epoxy resin (VG-3101, product of Mitsui Chemicals, Inc.), 18 parts by weight of a solid novolac-type epoxy resin (EPPN201, product of NIPPON KAYAKU CO., LTD.), 10 parts by weight of a liquid bisphenol-A epoxy resin (EPICLON 850s, DIC Corporation), 0.5 parts by weight of a photo-cation curing initiator (SP-170, product ADEKA CORPORATION), 0.5 parts by weight of a heat-cation curing initiator (SI-150L, product of SANSHIN CHEMICAL INDUSTRY, CO., LTD.), and 0.1 parts by weight of a surface conditioner (F470, product of DIC Corporation) are dissolved in a mixture solvent of 30 parts by weight of toluene and 70 parts by weight of MEK. The obtained solution was filtered by a membrane filter having a pore size of 1 µm and was subjected to vacuum degassing. By doing so, an epoxy resin varnish was prepared. The prepared varnish was applied to a PET film (A4100, product of TOYOBO CO., LTD.) using a multi-coater of a comma coater head (product of HIRANO TECSEED Co., Ltd.) and was dried to obtain a resin layer having a predetermined thickness. A release film (OPP-MA420, product of Oji Specialty Paper Co., Ltd.) was heat-laminated on the resin layer. By doing so, a core resin film was obtained. The thickness of the obtained core resin film was 30 µm.

(Manufacturing of Second Cladding Layer Resin Film)

A second cladding layer resin film was manufactured under the same conditions as the first cladding layer resin film except that the thickness was 40 µm.

Practical Example 1

The optical-electrical composite flexible circuit substrate shown in FIGS. 1A, 1B, 2A, and 2B was manufactured according to the manufacturing method shown in FIGS. 13A to 13I using the respective materials.

Specifically, the optical-electrical composite flexible circuit substrate was manufactured in the following manner.

First, a flexible printed wiring substrate (double-sided substrate) having an external size of 130 mm by 130 mm was obtained using a flexible double-sided copper-clad laminated substrate (FELIOS (R-F775), product of Panasonic Electric Works Co., Ltd.) in which a copper foil having a thickness of 12 µm is laminated on both sides of a polyimide film having a thickness of 20 µm. Twenty final product shapes (hereinafter also referred to as "individual pieces") were arranged at a pitch of 4 mm (center-to-center distance: 4 mm). A schematic shape of each individual piece schematically is shown in FIGS. 12A to 12C. The individual piece had a component mounting pattern that was formed in regions (mounting regions) of the copper foil on one side, located at the end of the substrate. A linear pattern was formed in central regions (bending regions) of the copper foil on the opposite side, connecting the mounting regions. Further, the component mounting pattern and the linear pattern were connected at through-holes. The linear pattern had a width W1 of 300 µm. Moreover, two linear patterns were formed with a separation of 1.2 mm. That is, the distance W2 between the linear patterns was 1.2 mm. Moreover, the width W3 of the individual piece was 2 mm.

Subsequently, a strong adhesion surface of a removable double-sided adhesive tape (No. 7692, product of TERAOKA SEISAKUSHO CO., LTD.) was laminated on the entire surface of one side of a glass substrate having dimensions of 140 mm by 140 mm by 2 mm (thickness) under conditions of 80° C. and 0.2 MPa using a pressurizing vacuum laminator (V-130 (hereinafter simply referred to as "vacuum laminator V-130"), product of Nichigo-Morton Co., Ltd.). The surface of the flexible substrate was laminated on a weak adhesion surface of the double-sided adhesive tape under the same conditions using the vacuum laminator V-130. By doing so, the flexible substrate was temporarily attached to the glass substrate serving as a temporary substrate, as shown in FIG. 13B.

Subsequently, as shown in FIG. 13C, the first cladding layer resin film having a thickness of 15 µm was laminated on the surface of the flexible substrate opposite to the glass substrate under the same conditions as above using the vacuum laminator V-130. The laminated first cladding layer resin film was irradiated with ultraviolet light under the condition of 2 J/cm$^2$ using an ultrahigh-pressure mercury lamp. Further, after a release film of the first cladding layer resin film was separated, the first cladding layer resin film was heat-treated at 150° C. for 30 minutes and was plasma-treated. By doing so, the first cladding layer resin film was cured and the first cladding layer (lower cladding layer) was formed.

Subsequently, the core resin film having a thickness of 30 µm was laminated on the first cladding layer under the same conditions as above using the vacuum laminator V-130. The core resin film was exposed by irradiating the same with ultraviolet light under the condition of 3 J/cm$^2$ using an ultra-high-pressure mercury lamp so that a core portion having a predetermined shape was obtained. Specifically, the core resin film was irradiated with ultraviolet light using a mask in which four slits corresponding to linear patterns having a width of 30 µm and a length of 120 mm were arranged at a pitch of 250 µm and were formed in the respective individual pieces. By doing so, the portion corresponding to the core portion was cured.

Subsequently, after the release film was separated from the core resin film, and the core resin film was heat-treated at 140° C. for 2 minutes. A developing process was performed using an aqueous flux cleaning agent (Pine Alpha ST-100SX, product of ARAKAWA CHEMICAL INDUSTRIES, LTD.) adjusted to 55° C. as a developing solution. By doing so, a non-exposed portion of the core resin film was dissolved and removed. Further, the core resin film was finish-cleaned with water and was air-blown. After that, drying was performed at 100° C. for 10 minutes. By doing so, the core portion as shown in FIG. 13D was formed.

Subsequently, as shown in FIG. 13E, two portions at both ends of the core portion were cut under conditions of a rotating speed of 10000 rpm and a moving speed of 0.1 mm/sec using a blade (Model Number B1E863SD5000L100MT38 (grain size #5000), product of DISCO CORPORATION) in which a blade edge surface has an angle of 45° with respect to a plane direction of the blade, that is, the apex angle is 90°. By doing so, a 45° inclined surface was formed on the core portion as shown in FIG. 13E. In this case, the cutting depth was 35 µm from the surface of the core portion.

Subsequently, a solution obtained by diluting by 50 times the resin varnish used for manufacturing the first cladding layer resin film using a mixture solvent of toluene and MEK (in a weight ratio of 3:7) was thinly applied to the 45° inclined surface using a brush. After that, the first cladding layer resin film was dried at 100° C. for 30 minutes and was irradiated with ultraviolet light under the condition of 1 J/cm$^2$ using an ultrahigh-pressure mercury lamp. After that, a heat treatment was performed at 120° C. for 10 minutes. By doing so, the 45° inclined surface was flattened.

Subsequently, as shown in FIG. 13F, gold having a thickness of 1000 Å was vacuum-deposited to the surface of the 45° inclined surface using a mask in which only the region where the 45° inclined surface was formed is open, whereby a micro-mirror was obtained.

Subsequently, as shown in FIG. 13G, a second cladding layer resin film having a thickness of 40 µm was laminated so as to cover the first cladding layer and the core portion under the conditions of 80° C. and 0.3 MPa using the vacuum laminator V-130. The second cladding layer resin film was heat-treated at 120° C. for 30 minutes and was irradiated with ultraviolet light under the condition of 2 J/cm$^2$ using an ultrahigh-pressure mercury lamp. After that, the release film of the second cladding layer resin film was separated. After that, heat treatment was performed at 150° C. for 30 minutes. By doing so, the second cladding layer (upper cladding layer) was formed so as to cover the first cladding layer and the core portion.

Subsequently, the surface of the second cladding layer was subjected to an oxygen plasma treatment. After that, as shown in FIG. 13H, a coverlay film (halogen-free coverlay film R-CAES, product of Panasonic Electric Works Co., Ltd., which is a laminated film having a 15 µm-thick adhesive layer on one surface of a 12.5 µm-thick polyimide film) was laminated on the second cladding layer under the conditions of 120° C. and 0.3 MPa using the vacuum laminator V-130. After that, the second cladding layer was heated at 160° C. for 1 hour. By doing so, the adhesive layer of the coverlay film was cured.

Subsequently, as shown in FIG. 13I, the glass substrate was separated from the flexible substrate, and plating of gold to the copper which is the electrical circuit exposed to the surface and forming of a solder resist layer were performed. Finally, the obtained flexible substrate was cut with a router, whereby the optical-electrical composite flexible circuit substrate having dimensions of 2 mm (width) by 110 mm (length) as shown in FIGS. 1A, 1B, 2A, and 2B was obtained.

Practical Example 2

The optical-electrical composite flexible circuit substrate shown in FIGS. 7A and 7B was manufactured according to the manufacturing method shown in FIGS. 14A to 14L using the respective materials.

The other conditions were the same as those of Practical Example 1 except for the following differences.

As a first difference, when the first cladding layer was formed, the first cladding layer resin film was irradiated with ultraviolet light so that the first cladding layer had the shape as shown in FIG. 14C.

As a second difference, when the second cladding layer was formed, the second cladding layer resin film was irradiated with ultraviolet light so that the second cladding layer has the shape as shown in FIG. 14I.

As a third difference, the coverlay layer was formed so as to cover the optical circuit using a coverlay film having a thick adhesive layer as shown in FIG. 14K. Specifically, a halogen-free coverlay film R-CAES (product of Panasonic Electric Works Co., Ltd., which is a laminated film having a 25 µm-thick adhesive layer on one surface of a 25 µm-thick polyimide film) was used.

By doing so, the optical-electrical composite flexible circuit substrate having dimensions of 2 mm (width) by 110 mm (length) as shown in FIGS. 7A and 7B was obtained.

Practical Example 3

The optical-electrical composite flexible circuit substrate shown in FIGS. 8A, 8B, 9A, and 9B was manufactured according to the manufacturing method shown in FIGS. 16A to 16I using the respective materials.

Specifically, the optical-electrical composite flexible circuit substrate was manufactured in the following manner.

First, a flexible printed wiring substrate (double-sided substrate) having an external size of 130 mm by 130 mm was obtained using a flexible double-sided copper-clad laminated substrate (FELIOS (R-F775), product of Panasonic Electric Works Co., Ltd.) in which a copper foil having a thickness of 12 µm is laminated on both sides of a polyimide film having a thickness of 20 µm. Twenty final product shapes (hereinafter also referred to as "individual pieces") were arranged at a pitch of 4 mm (center-to-center distance: 4 mm). A schematic shape of each individual piece schematically is shown in FIGS. 15A to 15C. The individual piece had a component mounting pattern that was formed in regions (mounting regions) of the copper foil on one side, located at the end of the substrate and had a linear pattern that connected the mounting regions. The copper foil on the other surface (rear surface) was etched off.

Subsequently, a strong adhesion surface of a removable double-sided adhesive tape (No. 7692, product of TERAOKA SEISAKUSHO CO., LTD.) was laminated on the entire surface of one side of a glass substrate having dimensions of 140 mm by 140 mm by 2 mm (thickness) under conditions of 80° C. and 0.2 MPa using a pressurizing vacuum laminator (V-130 (hereinafter simply referred to as "vacuum laminator V-130"), product of Nichigo-Morton Co., Ltd.). The surface of the flexible substrate, on which the patterns were not formed, was laminated on a weak adhesion surface of the double-sided adhesive tape under the same conditions using the vacuum laminator V-130. By doing so, the flexible substrate was temporarily attached to the glass substrate serving as a temporary substrate, as shown in FIG. 16B.

Subsequently, as shown in FIG. 16C, the first cladding layer resin film having a thickness of 15 µm was laminated on the surface of the flexible substrate opposite to the glass substrate under the same conditions as above using the vacuum laminator V-130. The laminated first cladding layer resin film was irradiated with ultraviolet light under the condition of 2 J/cm² using an ultrahigh-pressure mercury lamp. Further, after a release film of the first cladding layer resin film was separated, the first cladding layer resin film was heat-treated at 150° C. for 30 minutes and was plasma-treated. By doing so, the first cladding layer resin film was cured and the first cladding layer (lower cladding layer) was formed.

After that, the core portion, the second cladding layer, and the coverlay layer were formed according to the same method as Practical Example 1. By doing so, the laminated structure as shown in FIG. 16H was obtained.

Subsequently, as shown in FIG. 16I, the glass substrate was separated from the flexible substrate. The surface of the substrate exposed after the glass substrate was separated was scanned by a UV-YAG laser (Model 5330, product of Electro Scientific Industries, Inc.) with the output of 0.5 W and 60 kHz, whereby a via-hole having a diameter of 50 µm was formed. The via-hole reached up to the surface of the electrical circuit and became a connecting port to other components. Finally, the obtained flexible substrate was cut with a router, whereby the optical-electrical composite flexible circuit substrate having dimensions of 2 mm (width) by 110 mm (length) as shown in FIGS. 8A, 8B, 9A, and 9B was obtained.

Practical Example 4

The optical-electrical composite flexible circuit substrate shown in FIGS. 11A and 11B was manufactured using the respective materials.

The other conditions were the same as those of Practical Example 1 except for the following differences.

As a first difference, when the first cladding layer was formed, the first cladding layer resin film was irradiated with ultraviolet light so that the first cladding layer had the shape as shown in FIGS. 11A and 11B.

As a second difference, when the second cladding layer was formed, the second cladding layer resin film was irradiated with ultraviolet light so that the second cladding layer has the shape as shown in FIGS. 11A and 11B.

As a third difference, the coverlay layer was formed so as to cover the optical circuit using a coverlay film having a thick adhesive layer as shown in FIGS. 11A and 11B. Specifically, a halogen-free coverlay film R-CAES (product of Panasonic Electric Works Co., Ltd., which is a laminated film having a 25 µm-thick adhesive layer on one surface of a 25 µm-thick polyimide film) was used.

By doing so, the optical-electrical composite flexible circuit substrate having dimensions of 2 mm (width) by 110 mm (length) as shown in FIGS. 11A and 11B was obtained.

Comparative Example

The optical-electrical composite flexible circuit substrate shown in FIGS. 17A, 17B, 18A, and 18B was manufactured according to the manufacturing method shown in FIGS. 19A to 19I using the respective materials.

Specifically, the optical-electrical composite flexible circuit substrate was manufactured according to the same method as Practical Example 3, except that the glass substrate was laminated on the surface of the flexible substrate, on which the respective patterns were formed, and the optical circuit was formed on the surface on which the respective patterns were not formed. By doing so, the optical-electrical composite flexible circuit substrate as shown in FIGS. 17A, 17B, 18A, and 18B was manufactured.

(Evaluation)

The optical-electrical composite flexible circuit substrates according to Practical Examples 1 to 4 and Comparative Example were evaluated in the following manner.

First, electrical conduction loss and optical waveguide loss of the optical-electrical composite flexible circuit substrate were measured.

A cycle test (IPC TM-650) which is the IPC standard bending test for sliding-type mobile phones was performed on the optical-electrical composite flexible circuit substrate. Specifically, the bending test were repeated for 200000 times so that the electrical circuit was on the outer side under conditions of a bending radius (radius of curvature) of 1 mm and a bending frequency of 120 times/minute using IPC-02 (product of Toyo Seiki Seisaku-sho Ltd.).

After that, electrical conduction loss and optical waveguide loss of the optical-electrical composite flexible circuit substrate were measured again.

The measurement results showed that the ratio of the electrical conduction loss after the bending test to the electrical conduction loss before the bending test was less than 5% for the optical-electrical composite flexible circuit substrates according to Practical examples 1 to 4 and Comparative Example. Further, the difference between the optical waveguide loss before the bending test and the optical waveguide loss after the bending test was less than 0.5 dB for the optical-electrical composite flexible circuit substrates according to Practical Examples 1 to 4. In contrast, in the optical-electrical composite flexible circuit substrate according to Comparative Example, cracks were formed in the optical circuit after the bending test.

From the above, it could be understood that the optical-electrical composite flexible circuit substrates (Practical Examples 1 to 4) in which the electrical circuit and the optical circuit were disposed near the neutral surface when the optical-electrical composite flexible circuit substrate was bent had more excellent bending resistance than the optical-electrical composite flexible circuit substrate (Comparative Example) in which the electrical circuit and the optical circuit were separated, and any one of the electrical circuit and the optical circuit was located away from the neutral surface.

Although the present description discloses various aspects of techniques as described above, major techniques among them are summarized as follows.

According to an aspect of the present invention, there is provided an optical-electrical composite flexible circuit substrate including: an optical circuit that includes a core portion and a cladding layer that covers the core portion; and an electrical circuit, wherein the optical circuit and the electrical circuit are disposed at a position that includes a neutral surface when the optical-electrical composite flexible circuit substrate is bent, or at a position near the neutral surface.

According to this configuration, it is possible to provide an optical-electrical composite flexible circuit substrate having sufficiently high bending resistance.

This is considered to be due to the following reasons. The optical circuit and the electrical circuit are disposed at the position that includes the neutral surface when the optical-electrical composite flexible circuit substrate is bent or at the position near the neutral surface. Thus, the force applied to the optical circuit and the electrical circuit when the optical-electrical composite flexible circuit substrate is bent decreases.

In the optical-electrical composite flexible circuit substrate, it is preferable that the optical circuit and the electrical circuit are disposed so that a position of the electrical circuit in a thickness direction of the optical-electrical composite flexible circuit substrate overlaps a position of the optical circuit in the thickness direction of the optical-electrical composite flexible circuit substrate, and that the neutral surface when the optical-electrical composite flexible circuit substrate is bent is positioned in at least one of the optical circuit and the electrical circuit.

According to this configuration, it is possible to provide an optical-electrical composite flexible circuit substrate having sufficiently high bending resistance. This is considered to be due the fact that the optical circuit and the electrical circuit are both disposed at the position that includes the neutral surface when the optical-electrical composite flexible circuit substrate is bent or at the position near the neutral surface.

In the optical-electrical composite flexible circuit substrate, it is preferable that the electrical circuit is in contact with the optical circuit.

According to this configuration, it is possible to provide an optical-electrical composite flexible circuit substrate having sufficiently high bending resistance. This is considered to be due the fact that the optical circuit and the electrical circuit are both disposed at the position that includes the neutral surface when the optical-electrical composite flexible circuit substrate is bent or at the position near the neutral surface.

In the optical-electrical composite flexible circuit substrate, it is preferable that the core portion and the electrical circuit are disposed with the neutral surface interposed.

According to this configuration, it is possible to provide an optical-electrical composite flexible circuit substrate having sufficiently high bending resistance. This is considered to be due the fact that the optical circuit and the electrical circuit are both disposed at the position that includes the neutral surface when the optical-electrical composite flexible circuit substrate is bent or at the position near the neutral surface.

In the optical-electrical composite flexible circuit substrate, it is preferable that the electrical circuit includes a connecting portion that is electrically connected to an external unit, and the connecting portion is exposed to the outside of the optical-electrical composite flexible circuit substrate so as to be electrically connected to the electrical circuit other than the connecting portion.

According to this configuration, although the electrical circuit cannot be electrically connected to components if the electrical circuit is present at the position that includes the neutral surface or at the position near the neutral surface, the connecting portion allows the electrical circuit to be electrically connected to the components.

According to another aspect of the present invention, there is provided an optical-electrical composite flexible circuit substrate including: an optical circuit that includes a core portion and a cladding layer that covers the core portion; and a substrate that includes an electrical circuit, wherein the substrate and the optical circuit are laminated so that the electrical circuit is disposed on a side closer to the optical circuit.

According to this configuration, it is possible to provide an optical-electrical composite flexible circuit substrate having sufficiently high bending resistance.

This is considered to be due to the following reasons.

First, when the substrate and the optical circuit are laminated so that the electrical circuit is disposed on the side closer to the optical circuit, the electrical circuit and the optical circuit are disposed in a central portion in the thickness direction of the optical-electrical composite flexible circuit substrate. By doing so, the force applied to the optical circuit and the electrical circuit when the optical-electrical composite flexible circuit substrate is bent is smaller than the force applied to the portions located closer to the surface layer than the optical circuit and the electrical circuit.

In the optical-electrical composite flexible circuit substrate, it is preferable that the electrical circuit includes a connecting portion that is exposed from a surface of the substrate at a position located away from the optical circuit so as to be electrically connected to the outside of the optical-electrical composite flexible circuit substrate.

According to this configuration, although the electrical circuit cannot be electrically connected to components as it is if the substrate and the optical circuit are laminated so that the electrical circuit is disposed on the side closer to the optical circuit, the connecting portion allows the electrical circuit to be electrically connected to the components.

INDUSTRIAL APPLICABILITY

According to the present invention, an optical-electrical composite flexible circuit substrate having sufficiently high bending resistance is provided.

EXPLANATION OF REFERENCE NUMERALS

1: core portion
10: optical-electrical composite flexible circuit substrate
11: core portion
11*a*: inclined surface
12: cladding layer
13: optical circuit
14: electrical circuit
15: base member (first insulating layer)
16: substrate (electrical flexible wiring substrate)
18: coverlay layer (second insulating layer)
19: solder resist layer
21: bending region
22: mounting region
23: metal layer
24: light passing portion
31: neutral surface

The invention claimed is:

1. An optical-electrical composite flexible circuit substrate comprising:
   an optical circuit that includes a core portion and a cladding layer that covers the core portion; and
   an electrical circuit, wherein
   the optical circuit and the electrical circuit are disposed at a position that includes a neutral surface when the optical-electrical composite flexible circuit substrate is bent, or at a position near the neutral surface, and
   the optical circuit and the electrical circuit are disposed so that a position of the electrical circuit in a thickness direction of the optical-electrical composite flexible circuit substrate overlaps a position of the optical circuit in the thickness direction of the optical-electrical composite flexible circuit substrate, and that the neutral surface when the optical-electrical composite flexible circuit substrate is bent is positioned in at least one of the optical circuit and the electrical circuit.

2. The optical-electrical composite flexible circuit substrate according to claim 1, wherein the electrical circuit is in contact with the optical circuit.

3. The optical-electrical composite flexible circuit substrate according to claim 1, wherein the core portion and the electrical circuit are disposed with the neutral surface interposed.

4. The optical-electrical composite flexible circuit substrate according to claim 1, wherein
the electrical circuit includes a connecting portion that is electrically connected to an external unit, and
the connecting portion is exposed to the outside of the optical-electrical composite flexible circuit substrate so as to be electrically connected to the electrical circuit other than the connecting portion.

* * * * *